United States Patent
Urata

(10) Patent No.: US 10,804,881 B2
(45) Date of Patent: Oct. 13, 2020

(54) ACOUSTIC WAVE DEVICE

(71) Applicant: KYOCERA Corporation, Kyoto-shi, Kyoto (JP)

(72) Inventor: Tomonori Urata, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/539,561

(22) PCT Filed: Dec. 24, 2015

(86) PCT No.: PCT/JP2015/086020
§ 371 (c)(1),
(2) Date: Jun. 23, 2017

(87) PCT Pub. No.: WO2016/104598
PCT Pub. Date: Jun. 30, 2016

(65) Prior Publication Data
US 2017/0359051 A1    Dec. 14, 2017

(30) Foreign Application Priority Data
Dec. 26, 2014   (JP) .................................. 2014-265333

(51) Int. Cl.
*H03H 9/64*   (2006.01)
*H03H 9/02*   (2006.01)
(Continued)

(52) U.S. Cl.
CPC ...... *H03H 9/6489* (2013.01); *H03H 9/02992* (2013.01); *H03H 9/0538* (2013.01); *H03H 9/1064* (2013.01); *H03H 9/14547* (2013.01); *H03H 9/25* (2013.01); *H03H 9/725* (2013.01); *H03H 9/02559* (2013.01); *H03H 9/6483* (2013.01)

(58) Field of Classification Search
CPC .................................................. H03H 9/54–76
USPC ................................................. 333/193–196
See application file for complete search history.

(56) References Cited

U.S. PATENT DOCUMENTS 5,998,907 A * 12/1999 Taguchi ............. H03H 9/02574
310/313 R
7,570,149 B2 * 8/2009 Kondo ................... H01C 1/146
333/193
(Continued)

FOREIGN PATENT DOCUMENTS

JP    H5-22074 A    1/1993
JP    H5-167384 A    7/1993
(Continued)

OTHER PUBLICATIONS

International Search Report dated Mar. 1, 2016, issued by Japan Patent Office for International Application No. PCT/JP2015/086020.

*Primary Examiner* — Dean O Takaoka
*Assistant Examiner* — Alan Wong
(74) *Attorney, Agent, or Firm* — Procopio Cory Hargreaves and Savitch LLP

(57) ABSTRACT

An SAW device includes a piezoelectric substrate, an IDT electrode on a first major surface of the piezoelectric substrate, a capacitance element which is located on the first major surface and is connected to the IDT electrode, and a cover which is superimposed only on the capacitance element between the IDT electrode and the capacitance element.

14 Claims, 15 Drawing Sheets

(51) Int. Cl.
*H03H 9/10* (2006.01)
*H03H 9/72* (2006.01)
*H03H 9/145* (2006.01)
*H03H 9/05* (2006.01)
*H03H 9/25* (2006.01)

(56) References Cited

U.S. PATENT DOCUMENTS

| | | | |
|---|---|---|---|
| 7,583,161 B2 * | 9/2009 | Tanaka | H03H 9/725 |
| | | | 333/133 |
| 7,688,161 B2 * | 3/2010 | Miura | H03H 9/6483 |
| | | | 310/313 B |
| 7,741,930 B2 * | 6/2010 | Inoue | H03H 9/0042 |
| | | | 333/133 |
| 8,736,149 B2 * | 5/2014 | Inoue | H01L 23/315 |
| | | | 310/313 R |
| 8,941,974 B2 * | 1/2015 | Wu | H01L 28/86 |
| | | | 361/305 |
| 10,050,601 B2 * | 8/2018 | Murase | H03H 9/64 |
| 2008/0129418 A1 | 6/2008 | Miura et al. | |

FOREIGN PATENT DOCUMENTS

| | | | | |
|---|---|---|---|---|
| JP | H5-327399 A | | 12/1993 | |
| JP | H7-7369 A | | 1/1995 | |
| JP | 2000-77967 A | | 3/2000 | |
| JP | 2000077967 A | * | 3/2000 | |
| JP | 2005-260833 A | | 9/2005 | |
| JP | 2008-109413 A | | 5/2008 | |
| JP | 2011-254354 A | | 12/2011 | |
| JP | 2013-118444 A | | 6/2013 | |
| WO | 01/05030 A2 | | 1/2001 | |
| WO | WO 0105030 A2 | * | 1/2001 | H03H 9/14597 |

* cited by examiner

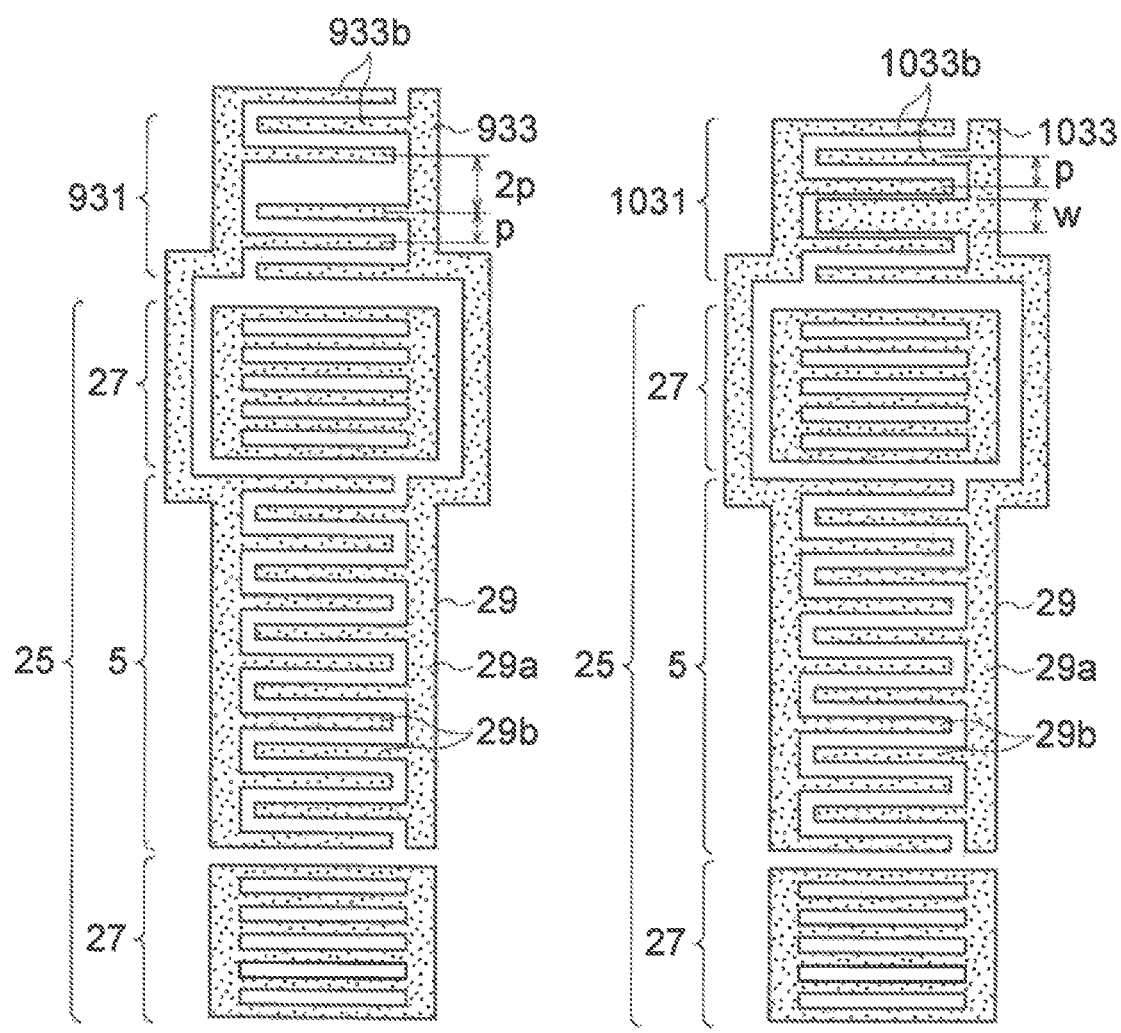

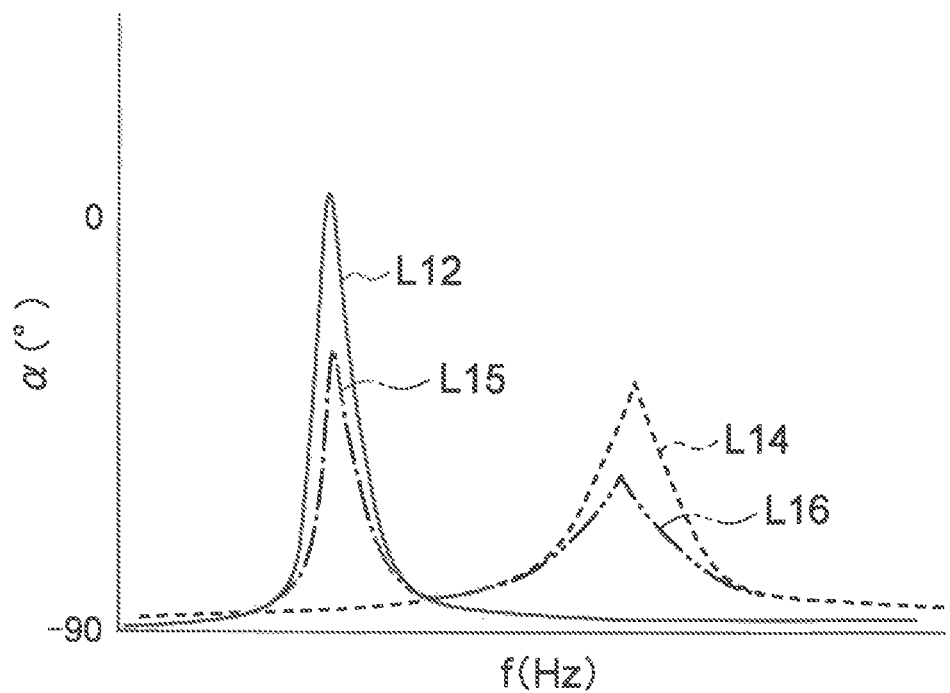
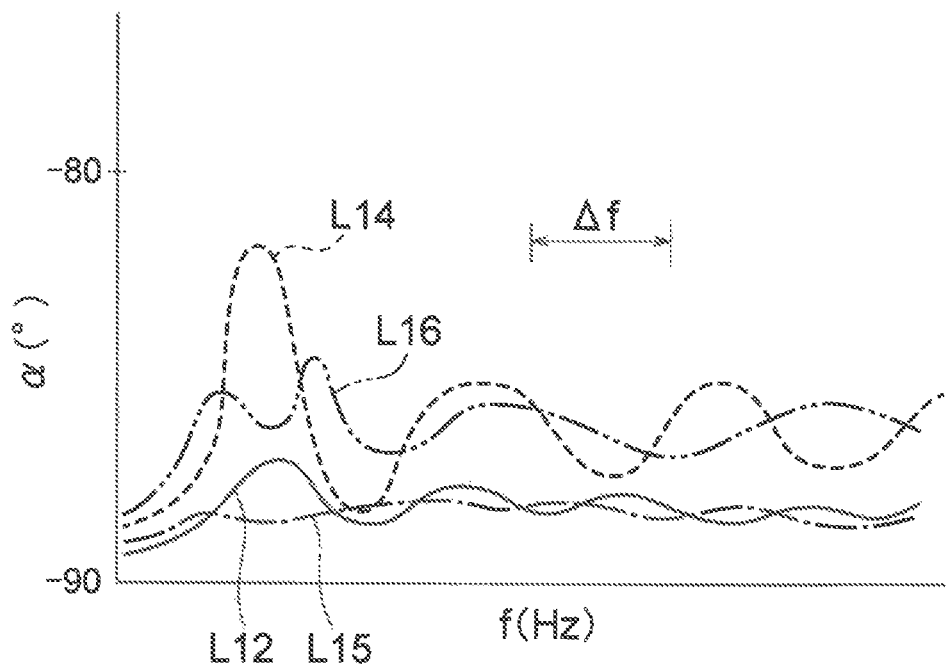

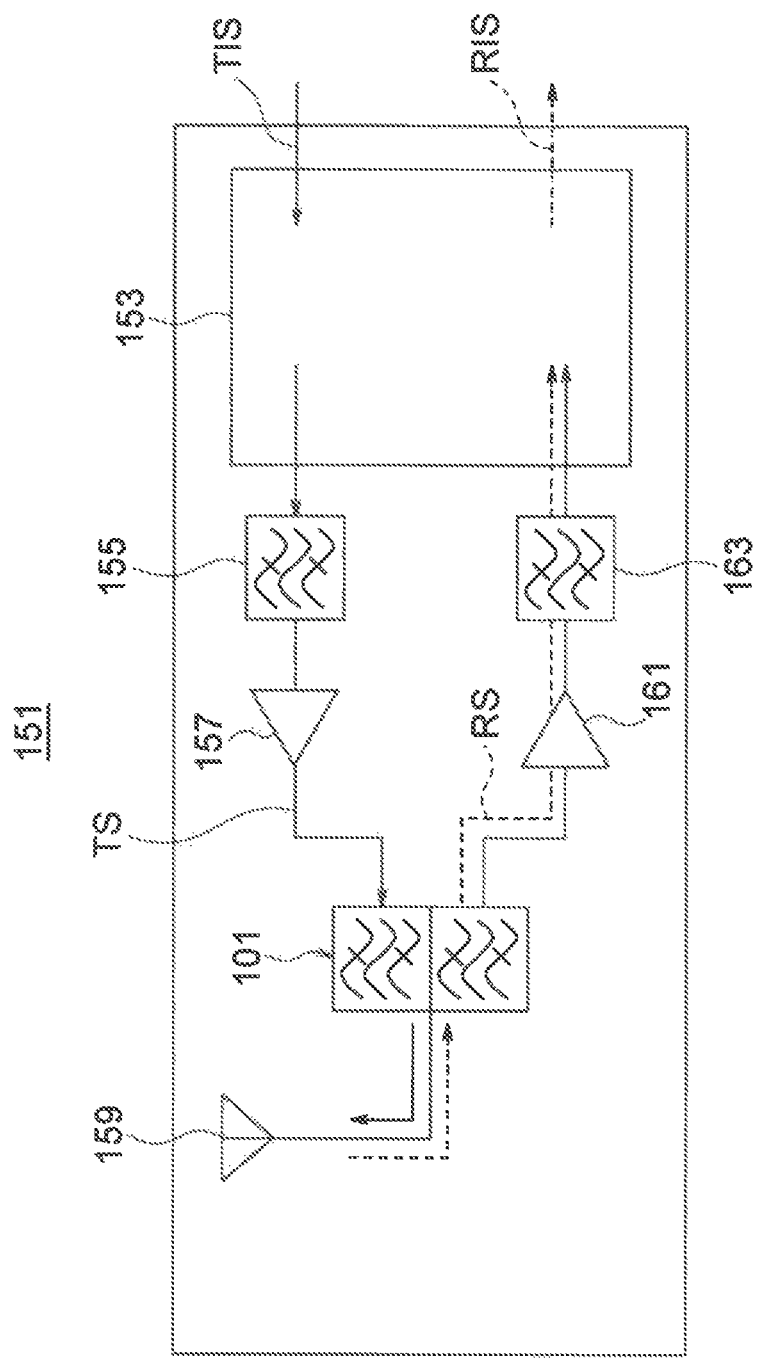

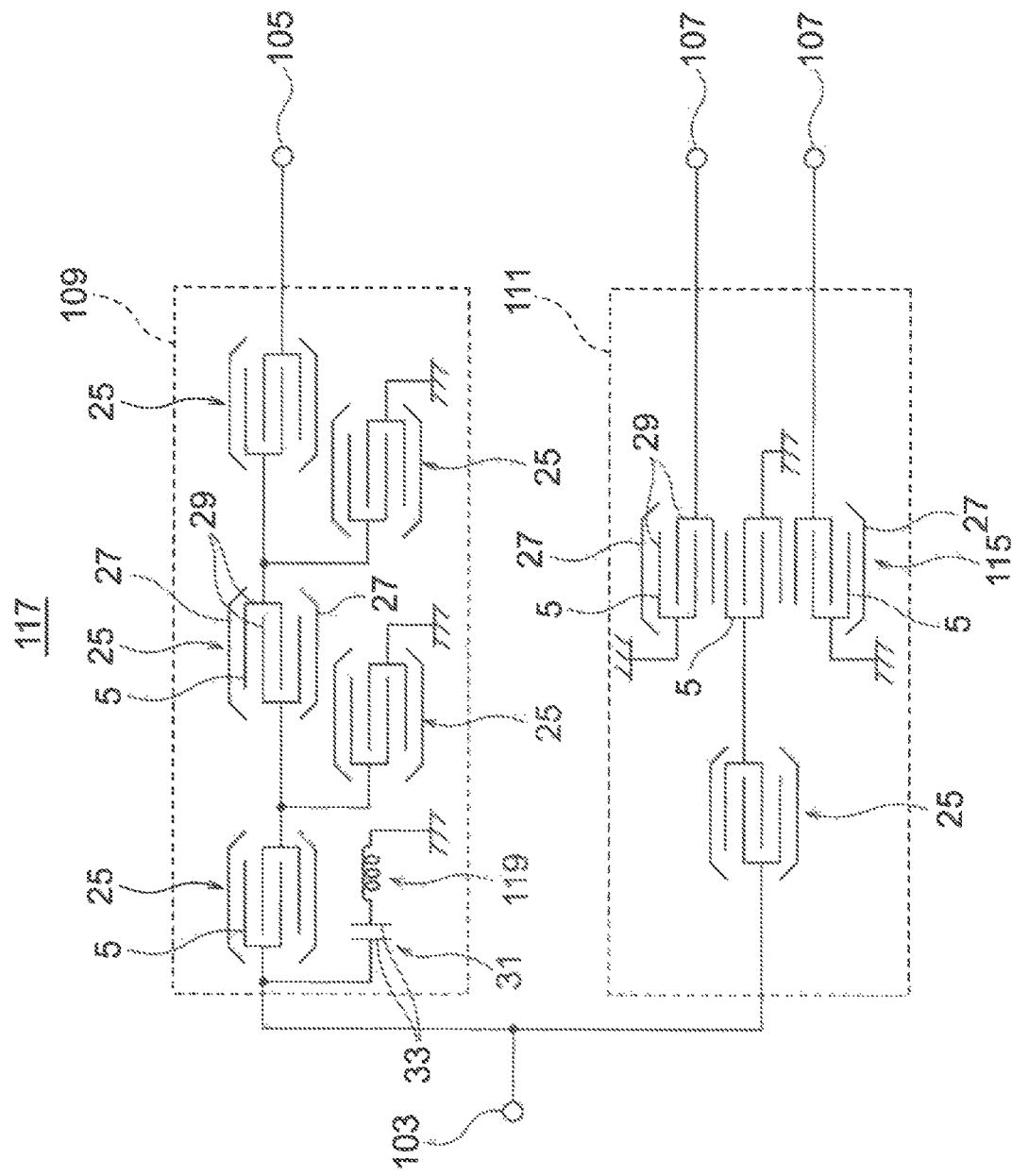

ACOUSTIC WAVE DEVICE

TECHNICAL FIELD

The present invention relates to an acoustic wave device utilizing a surface acoustic wave (SAW) or another acoustic wave.

BACKGROUND ART

As an acoustic wave device, for example, there is known a SAW device comprised of a piezoelectric substrate on which an excitation electrode for exciting a SAW is provided (for example PATENT LITERATUREs 1 and 2). The excitation electrode is configured by a pair of comb-shaped electrodes having pluralities of parallel-extending electrode fingers. PATENT LITERATUREs 1 and 2 disclose a SAW device provided with a capacitance element which is connected in parallel to the excitation electrode in order to improve the resonance characteristic of the excitation electrode.

The capacitance element in PATENT LITERATUREs 1 and 2 is configured by a pair of comb-shaped electrodes having pluralities of electrode fingers which extend in parallel. In PATENT LITERATURE 1, in order to reduce influence of a reflection wave of the SAW in the capacitance element, the electrode fingers in the capacitance element are inclined relative to the electrode fingers in the excitation electrode. In PATENT LITERATURE 2, in order to reduce the loss of the SAW device by raising the Q value of the capacitance element in a high frequency band, the capacitance element is provided at a position separated upward from the major surface of the piezoelectric substrate.

If, as in PATENT LITERATURE 1, the capacitance element is provided on the piezoelectric substrate, the capacitance element also excites the acoustic wave and resonates. As a result, the characteristics of the acoustic wave device fall. Further, if, as in PATENT LITERATURE 2, the capacitance element is separated from the piezoelectric substrate, the capacitance element must be configured by a conductive layer which is different from the excitation electrode. Further, the conductive layer is three-dimensionally arranged. Therefore the manufacturing cost increases.

Accordingly, provision of an acoustic wave device capable of suitably reducing resonance through the acoustic wave of the capacitance element has been desired.

CITATION LIST

Patent Literature

PATENT LITERATURE 1: Japanese Patent Publication No. 05-167384A
PATENT LITERATURE 2: Japanese Patent Publication No. 2008-109413A

SUMMARY OF INVENTION

An acoustic wave device according to one aspect of the present invention includes a piezoelectric substrate, an excitation electrode on a major surface of the piezoelectric substrate, a capacitance element which is located on the major surface and is connected to the excitation electrode, and an insulator which is superimposed only on the capacitance element between the excitation electrode and the capacitance element.

According to the above configuration, resonance through the acoustic wave of the capacitance element can be reduced.

BRIEF DESCRIPTION OF DRAWINGS

FIG. 9A and FIG. 9B are plan views showing SAW resonators and capacitance elements according to ninth and tenth embodiments.
FIG. 12A, is an enlarged view of a region XIIa in FIG. 11B,
and FIG. 12B is an enlarged view of a region XIIb in FIG. 11B.
FIG. 14 is a block diagram showing a communication apparatus as an example of use of a duplexer.
FIG. 15 is a block diagram showing a modification according to connection of the capacitance element.

DESCRIPTION OF EMBODIMENTS

Figure 1:
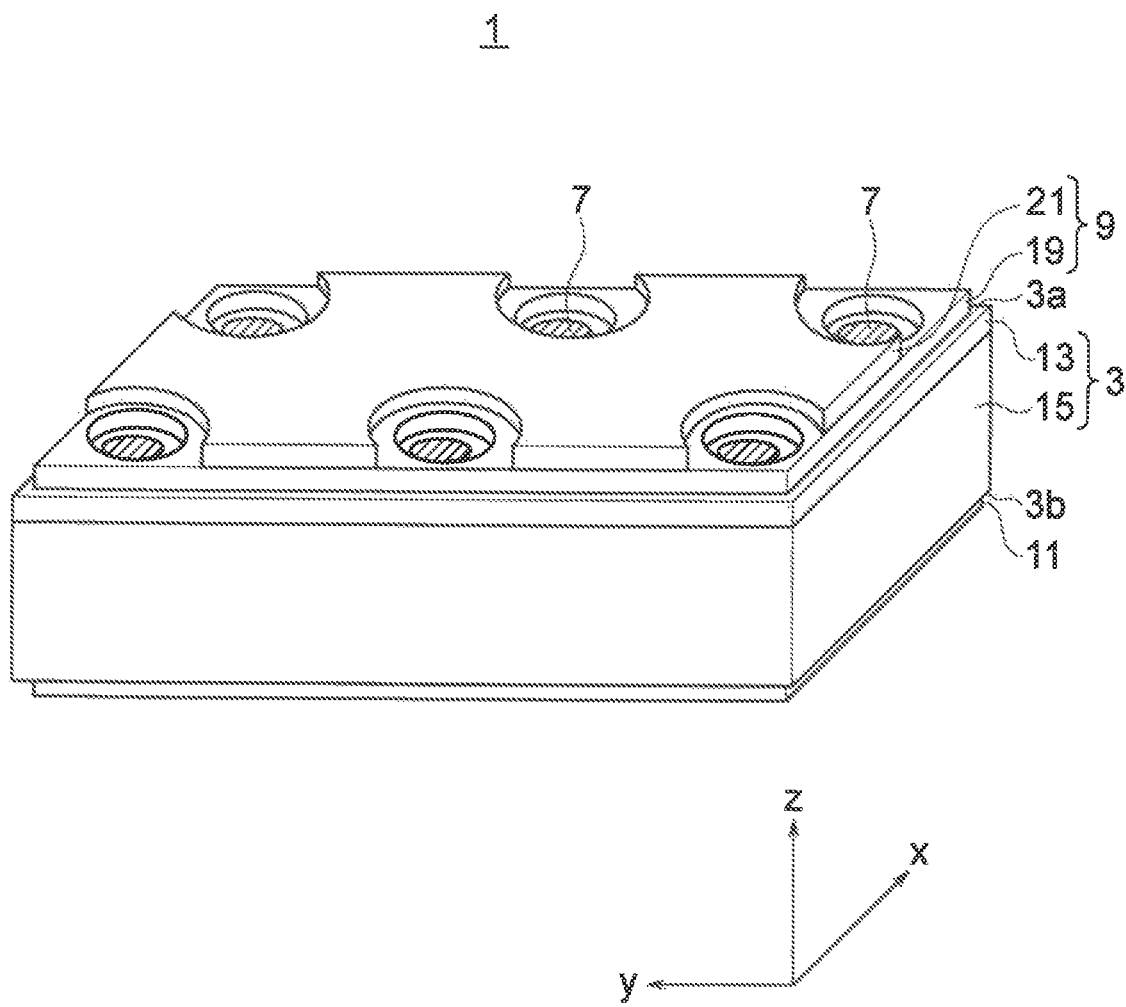
FIG. 1 is a perspective view of the appearance of a SAW device according to a first embodiment of the present invention.

Below, SAW devices according to embodiments of the present invention will be explained with reference to the drawings. Note that, the drawings used in the following explanation are schematic ones. Dimensions and ratios etc. in the drawings will not always coincide with actual ones.

In the second and following embodiments, sometimes configurations the same as or resembling those in the already explained embodiments will be assigned the same notations as the notations attached to the configurations in the already explained embodiments, and their illustrations and explanations will be omitted. Further, in the second and following embodiments, when notations which are different from the notations attached to the configurations in the already explained embodiments are attached to configurations the same as (resembling) the configurations in the already explained embodiments, the configurations are the same as the configurations in the already explained embodiments in matters not otherwise indicated.

First Embodiment

Figure 2:
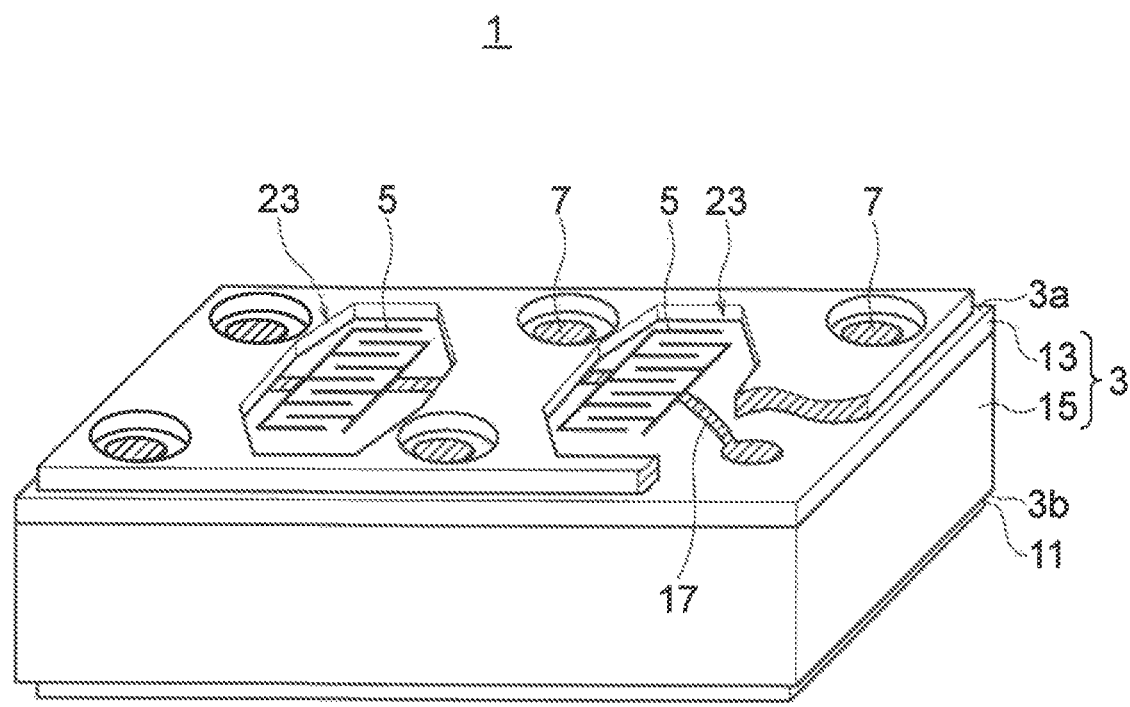
FIG. 2 is a perspective view showing the SAW device in FIG. 1 shown partially cut away.

FIG. 1 is a perspective view of the appearance of a SAW device 1 according to a first embodiment of the present invention. Further, FIG. 2 is a perspective view showing the SAW device 1 shown partially cut away.

In the SAW device 1, any direction may be defined as the upper part or lower part. In the following embodiments, however, for convenience, an orthogonal coordinate system xyz will be defined, and sometimes use will be made of the "upper surface", "lower surface", and other terms while defining the positive side of the z-direction (upper part side on the drawing sheet in FIG. 1) as the upper part. Note that, the orthogonal coordinate system xyz is defined based on the shape of the SAW device 1 and does not designate the electrical axis, mechanical axis, and optical axis of the piezoelectric substrate.

The SAW device 1 is for example a relatively small-size schematically rectangular parallelepiped shaped electronic part. The dimensions thereof may be suitably set. For example, the thickness is 0.1 mm to 0.4 mm, and the lengths of the long side and short side in a plan view are 0.5 mm to 3 mm. At the upper surface of the SAW device 1, a plurality of pads 7 are exposed. The SAW device 1 is arranged while making its upper surface face the major surface of a not shown mounting substrate and is mounted on the mounting substrate by bonding a not shown plurality of pads provided on the major surface of the mounting substrate with the plurality of pads 7 by bumps made of solder or the like. A resin sealing may be carried out after mounting as well.

The SAW device 1 is for example configured by so-called wafer level package (WLP) type SAW device. The SAW device 1 for example has an element substrate 3, IDT (InterDigital Transducer) electrodes 5 (FIG. 2) as excitation electrodes which are provided on a first major surface 3a of the element substrate 3, the already explained plurality of pads 7 which are provided on the first major surface 3a and are connected to the IDT electrodes 5, a cover 9 (FIG. 1) covering the IDT electrodes 5 and allowing the pads 7 to be exposed, and a rear face part 11 which is provided on a second major surface 3b of the element substrate 3.

In the SAW device 1, a signal is input through any of the plurality of pads 7. The input signal is filtered by the IDT electrodes 5 etc. Further, the SAW device 1 outputs the filtered signal through any of the plurality of pads 7. The concrete configurations of the members are as follows.

The element substrate 3 is for example configured by a so-called stacked substrate. That is, the element substrate 3 has a piezoelectric substrate 13 and a support substrate 15 which is adhered to the lower surface of the piezoelectric substrate 13.

The piezoelectric substrate 13 is for example configured by a substrate of a single crystal having piezoelectricity such as a tantalum niobate ($LiTaO_3$) or lithium niobate ($LiNbO_3$) single crystal. More preferably, the piezoelectric substrate 13 is configured by a 42°±10° Y-X cut $LiTaO_3$, 128°±10° Y-X cut $LiNbO_3$ substrate, or 0°±10° Y-X cut $LiNbO_3$ substrate etc. Other than them, use can be also made of a quartz ($SiO_2$) single crystal.

The thickness of the piezoelectric substrate 13 is for example constant, while the size thereof may be suitably set in accordance with the technical field to which the SAW device 1 is applied, specifications which are demanded from the SAW device 1, and so on. As an example, the thickness of the piezoelectric substrate 13 is 10 to 30 μm. The planar shape and various dimensions of the piezoelectric substrate 13 may also be suitably set.

The support substrate 15 is for example formed by a material having a smaller thermal expansion coefficient than that of the material for the piezoelectric substrate 13. Accordingly, if the temperature changes, thermal stress is generated in the piezoelectric substrate 13. At this time, the temperature dependency and the stress dependency of the elastic constant are cancelled by each other, so consequently the temperature change of the electrical characteristics of the SAW device 1 is compensated for. As such a material, for example, there can be mentioned single crystal such as sapphire, semiconductor such as silicon, and ceramic such as an aluminum oxide-based sintered product. Note that, the support substrate 15 may also be configured by lamination of a plurality of layers which are made of materials different from each other.

The thickness of the support substrate 15 is for example constant, while the size thereof may be suitably set in the same way as the thickness of the piezoelectric substrate 13. However, the thickness of the support substrate 15 is set considering the thickness of the piezoelectric substrate 13 so that temperature compensation is suitably carried out. As an example, for a thickness of the piezoelectric substrate 13 of 10 to 30 μm, the thickness of the support substrate 15 is 100 to 300 μm. The planar shape and various dimensions of the support substrate 15 are for example equal to those of the piezoelectric substrate 13.

The piezoelectric substrate 13 and the support substrate 15 are for example adhered to each other through a not shown bonding layer. The material of the bonding layer may be an organic material or inorganic material. As the organic material, for example, there can be mentioned a resin such as a thermosetting resin. As the inorganic material, for example, there can be mentioned $SiO_2$. Further, the two substrates may be adhered to each other by so-called "direct bonding" activating the bonding surfaces by plasma or the like, then adhering them to each other without a bonding layer.

The IDT electrodes 5, plurality of pads 7, and lines 17 for connecting them (FIG. 2) and the reflectors 27 (FIG. 3) and capacitance element 31 (FIG. 3) which will be explained later are for example configured by a conductive layer formed on the major surface (first major surface 3a) of the piezoelectric substrate 1 13. The thickness of the conductive layer is for example 100 to 500 nm. The conductive layer may be configured by one conductive material or may be configured by laminating a plurality of conductive materials.

Further, the IDT electrodes 5, plurality of pads 7, lines 17, and the reflectors 27 and capacitance element 31 which will be explained later are for example configured by the same conductive materials as each other. However, they may be configured by materials different from each other as well. Further, for example, on the pads 7, in addition to the layer which is made of the same material and has the same thickness as those of the IDT electrodes 5, another conductive layer may be superimposed for the purpose of improving the connectability with solder or the like. The conductive material is for example an Al alloy such as an Al—Cu alloy.

The number and positions of arrangement of the pads 7 and the number and arrangement of the lines 17 are suitably set in accordance with the configuration of the filter configured by the IDT electrodes 5 and so on. FIG. 1 and FIG. 2 illustrate a case where six pads 7 are arranged along the periphery of the first major surface 3a. The planar shape of the pad 7 may be suitably set. For example, it is a circle. The lines 17 may be provided so as to three-dimensionally cross through a not shown insulating material. In this case, the line 17 which becomes the upper side may be formed by a material different from that for the line 17 which becomes the lower side so as to be thicker than the line 17 which becomes the lower side.

The outer shape of cover 9 (FIG. 1) is for example formed to a substantially shape of a layer of a constant thickness which covers the entire first major surface 3a. That is, in the present embodiment, corresponding to the first major surface 3a being rectangular, the outer shape of the cover 9 is formed in substantially thin rectangular parallelepiped state. Further, the outer edges of the cover 9 are positioned at the inner sides from the outer circumference of the element substrate 3. Due to this, the bonding strength between the sealing resin and the element substrate 3 can be raised when coating the cover 9 by the sealing resin.

The cover 9 has a frame 19 (FIG. 1 and FIG. 2) which is provided on the first major surface 3a and surrounds the IDT electrodes 5 when viewing the first major surface 3a by a plan view and a lid 21 (FIG. 1) which is superimposed on the frame 19 and closes openings of the frame 19. Further, a space surrounded by the first major surface 3a (strictly speaking, a protective layer 35 which will be explained later), the frame 19, and the lid 21 forms a vibration space 23 (FIG. 2) for facilitating the excitation and propagation of a SAW.

The number, arrangement, and shape of the vibration spaces 23 may be set in accordance with the arrangement of the IDT electrodes 5 etc. FIG. 2 illustrates a case where two vibration spaces 23 made of polygonal shapes are provided. In FIG. 2, in each vibration space 23, one IDT electrode 5 is positioned. However, a plurality of IDT electrodes 5 may be arranged in each vibration space 23 as well. The plurality of IDT electrodes 5 may configure a ladder type filter and multiplex mode type SAW resonator filter or the like.

The frame 19 is configured by formation of one or more (two in FIG. 2) openings which form the vibration spaces 23 in a layer having a schematically constant thickness. The thickness of the frame 19 (height of the vibration spaces 23) is for example several μm to 30 μm. The lid 21 is configured by a layer having a substantially constant thickness. The thickness of the lid 21 is for example several μm to 30 μm.

The frame 19 and the lid 21 may be formed by the same material or may be formed by materials different from each other. In the present application, for convenience of explanation, a borderline of the frame 19 and the lid 21 is clearly indicated. However, in a real product, the frame 19 and the lid 21 may be integrally formed by the same material as well.

The cover 9 (frame 19 and lid 21) is for example formed by a photosensitive resin. The photosensitive resin is for example a urethane acrylate, polyester acrylate, or epoxy acrylate resin which is cured by radical polymerization of acrylic groups or methacrylic groups or the like. Other than these, use can be also made of a polyimide resin.

In the cover 9, for example, notches or holes for exposing the pads 7 are formed (notations are omitted). In the example in FIG. 1 and FIG. 2, holes are formed in the frame 19, and notches are formed in the lid 21. Note that, the pads 7 may be exposed, without forming notches or holes, by the cover 9 having an area smaller than that of the piezoelectric substrate 13 as well.

The rear face part 11, although not particularly shown, for example has a rear-surface electrode covering schematically the entire second major surface 3b of the element substrate 3 and an insulating protective layer covering the rear-surface electrode. By the rear-surface electrode, electric charges charged in the surface of the element substrate 3 due to the temperature change or the like are discharged. By the protective layer, damage of the element substrate 3 is suppressed.

Figure 3:
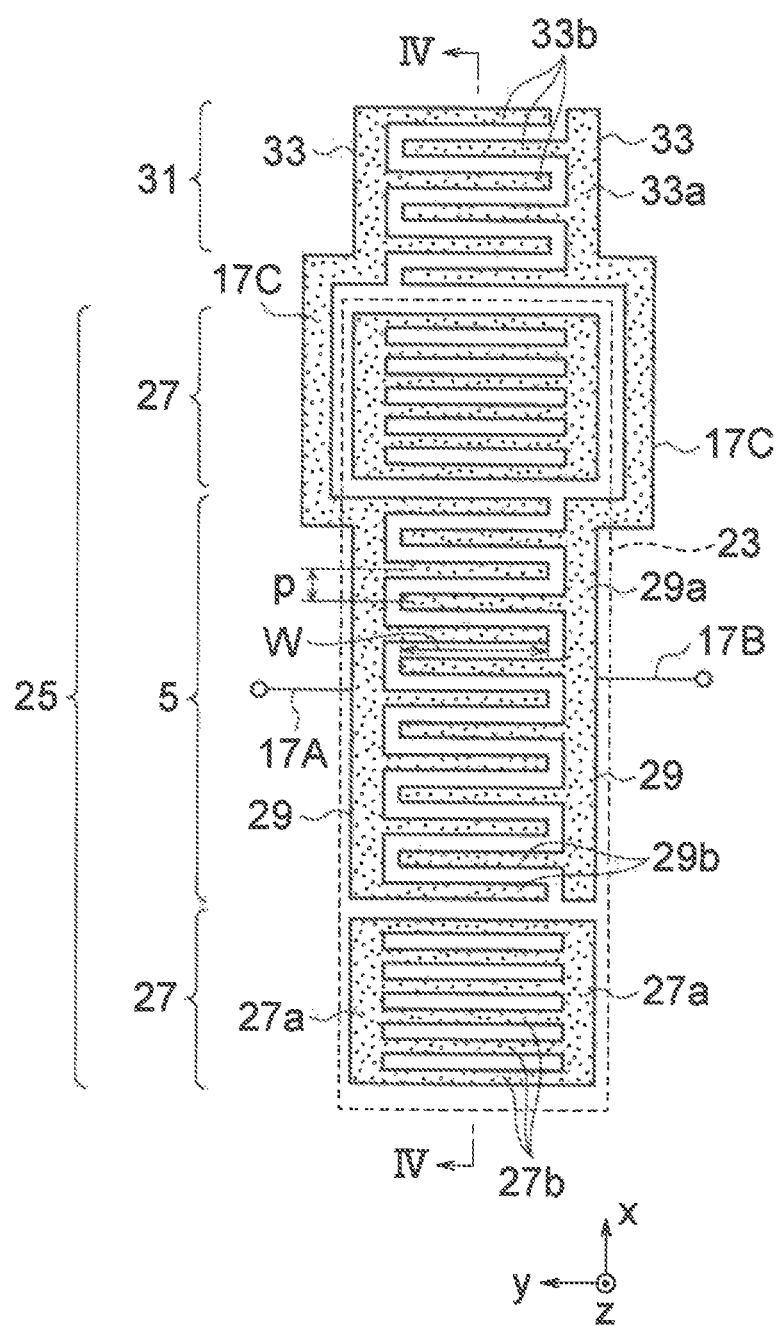
FIG. 3 is a plan view showing an IDT electrode in the SAW device in FIG. 1 and its periphery.

FIG. 3 is a plan view showing the IDT electrode 5 and its periphery. In this figure, the vibration space 23 is indicated by a dotted line.

Note that, in FIG. 3, one IDT electrode 5 is arranged in one vibration space 23. However, as already explained. a plurality of IDT electrodes 5 can be arranged in one vibration space 23 as well.

The IDT electrode 5, for example, together with two reflectors 27 arranged on the two sides thereof, configures a one-port type SAW resonator 25. Further, the capacitance element 31 is connected to the IDT electrode 5.

The SAW resonator 25, for example, receives as input a signal from an input line 17A as an example of the line 17, generates resonance through the SAW, and outputs the signal to an output line 17B as an example of the line 17. The capacitance element 31 contributes to improvement of the resonance characteristic of the SAW resonator 25.

Although not particularly shown, the SAW resonator 25 is for example utilized for a ladder type filter. Specifically, as is well known, a ladder type filter is configured by provision of a plurality of serial resonators (SAW resonators 25) connected in series and a plurality of parallel resonators (SAW resonators 25) connected between the plurality of serial resonators and the ground (reference potential). As already explained, this ladder type filter may be arranged in one vibration space 23.

The IDT electrode 5 has a pair of comb-shaped electrodes 29. The comb-shaped electrodes 29 have bus bars 29a facing each other and pluralities of electrode fingers 29b extending from the bus bars 29a toward the opposite directions. The pair of comb-shaped electrodes 29 are arranged so that the pluralities of electrode fingers 29a mesh (intersect) with each other.

Note that, the propagation direction of the SAW is defined according to the orientation of the pluralities of electrode fingers 29a and so on. However, in the present embodiment, for convenience, the orientation of the pluralities of electrode fingers 29b etc. will be sometimes explained by using the propagation direction of the SAW as a reference.

The bus bars 29a are for example formed in long shapes so as to linearly extend in the propagation direction of the SAW (x-direction) with substantially constant widths. The bus bars 29a of the pair of comb-shaped electrodes 29 face in the direction (y-direction) crossing the propagation direction of the SAW.

The plurality of electrode fingers 29b are for example formed in long shapes so as to linearly extend in the direction (y-direction) perpendicular to the propagation direction of the SAW with substantially constant widths and are arranged at substantially constant intervals in the propagation direction of the SAW (x-direction). The pluralities of electrode fingers 29b of the pair of comb-shaped electrodes 29 are provided so that their pitch "p" (for example, distance between centers of the electrode fingers 29b) for example becomes equal to a half wavelength of the wavelength λ of the SAW at the frequency where resonance is desired to be caused. The wavelength λ is for example 1.5 μm to 6 μm.

In portions of the pluralities of electrode fingers 29b, the pitch "p" may be made relatively small. Conversely, the pitch "p" may be made relatively large as well. It is known that the frequency characteristic of the SAW element are improved by providing such narrow pitch parts or broad pitch parts. Note that, in the present embodiment, when simply referring to the "pitch 'p'", unless particularly indicated other, this means the pitch "p" of a portion other than the pitch "p" of the narrow pitch part and broad pitch part (most part of the pluralities of electrode fingers 29b) or the mean value thereof.

The number, lengths (y-direction), and widths (x-direction) of the pluralities of electrode fingers 29b may be suitably set in accordance with the electrical characteristics etc. demanded from the SAW device 1. As an example, the number of the plurality of electrode fingers 29b in the SAW resonator 25 is 100 to 400. The lengths and widths of the pluralities of electrode fingers 29b are for example equal to each other.

The reflector 27 is for example formed in a lattice shape in a plan view. That is, the reflector 27 has a pair of bus bars 27a facing each other in the direction crossing the propagation direction of the SAW and a plurality of strips 27b which extend in the direction (y-direction) perpendicular to the propagation direction of the SAW between these bus bars 27a.

The bus bars 27a are for example formed in long shapes so as to linearly extend in the propagation direction of the SAW (x-direction) with substantially constant widths. The pair of bus bars 27a face each other in the direction (y-direction) crossing the propagation direction of the SAW.

The strips 27b are arranged with a pitch equal to that of the pluralities of electrode fingers 29b in the IDT electrode 5. Also, the pitch between the adjacent electrode finger 29b and strip 27b (clearance between the IDT electrode 5 and the reflector 27) is made equal to the pitch of the pluralities of electrode fingers 29b. The number, lengths (y-direction), and widths (x-direction) of the strips 27b may be suitably set in accordance with the electrical characteristics etc. demanded from the SAW resonator 25. For example, the number of the strips 27b is about 20 in each reflector 27.

When voltage is applied to the piezoelectric substrate 13 by the plurality of electrode fingers 29b, a SAW propagating along the upper surface (first major surface 3a) of the piezoelectric substrate 13 is induced in the vicinity of the first major surface 3a. This SAW is reflected at the pluralities of electrode fingers 29b and plurality of strips 27b. As a result, a standing wave of a SAW having the pitch "p" of the pluralities of electrode fingers 29b as the half wavelength is formed. The standing wave generates an electric charge (electrical signal having the same frequency as that of the standing wave) on the first major surface 3a. That electrical signal is extracted by the pluralities of electrode fingers 29b.

The capacitance element 31 is for example configured resembling the IDT electrode 5. Specifically, the capacitance element 31 has a pair of capacitance electrodes 33. The pair of capacitance electrodes 33 are configured by a pair of comb-shaped electrodes, and have bus bars 33a facing each other and pluralities of electrode fingers 33b extending from the bus bars 33a toward the opposite directions. The pair of capacitance electrodes 33 are arranged so that the plurality of electrode fingers 33b mesh (cross) with each other.

By such a configuration, the capacitance element 31 has an increased capacity although it is small in size. On the other hand, in the same way as the IDT electrode 5, resonance is liable to be caused through the SAW. Due to this, the electrical characteristics of the SAW device 1 are liable to fall.

The bus bars 33a are for example formed in long shapes so as to linearly extend in the propagation direction of the SAW (x-direction) and face each other in the direction (y-direction) crossing the propagation direction of the SAW. Accordingly, in the present embodiment, the bus bars 33a in the capacitance element 31 are parallel with respect to the bus bars 29a in the IDT electrode 5. The widths of the bus bars 33a are for example substantially constant.

The pluralities of electrode fingers 33b are for example formed in long shapes so as to linearly extend in the direction (y-direction) perpendicular to the propagation direction of the SAW. Accordingly, in the present embodiment, the electrode fingers 33b in the capacitance element 31 are parallel with respect to the electrode fingers 29b in the IDT electrode 5. In other words, the angle of the electrode fingers 33b relative to the electrode fingers 29b is 0°. The lengths and widths of the electrode fingers 33b are for example substantially constant.

The pitch "p" of the pluralities of electrode fingers 33b is substantially constant in the present embodiment. The pitch "p" of the pluralities of electrode fingers 33b is suitably set together with the lengths and numbers of the electrode fingers 33b so that the capacity to be obtained by the capacitance element 31 is acquired. The capacity of the capacitance element 31 may be suitably set according to a known example.

Further, the pitch "p" of the electrode fingers 33b in the capacitance element 31 is made different from the pitch "p" of the electrode fingers 29b in the IDT electrode 5 so that the influence by the resonance of the capacitance element 31 exerted upon the characteristics of the SAW resonator 25 is reduced. For example, the pitch "p" of the electrode fingers 33b is made larger than the pitch "p" of the electrode fingers 29b so that the resonance point of the capacitance element 31 is positioned on the lower frequency side than the resonance point of the IDT electrode 5. For example, the pitch "p" of the electrode fingers 33b is 1.5 times to 3 times the pitch "p" of the electrode fingers 29b.

The capacitance element 31 is for example positioned on one side of the propagation direction of the SAW with respect to the IDT electrode 5. Accordingly, when viewed in the propagation direction of the SAW, the crossing widths W of the pluralities of electrode fingers 33b in the capacitance element 31 (the lengths of overlap by the electrode fingers which are adjacent to each other when viewed in the propagation direction of the SAW) overlap the crossing widths W of the pluralities of electrode fingers 29b in the IDT electrode 5.

In such an arrangement, according to simulation and measurement results by the applicant, insertion loss by the capacitance element 31 is reduced. However, the capacitance element 31 may be arranged so that the crossing width W of the capacitance element 31 and the crossing width W of the IDT electrode 5 do not overlap each other as well. In this case as well, the insertion loss by the capacitance element 31 is reduced. Further, according to simulation and measurement results by the applicant, spurious emission due to the capacitance element 31 is reduced.

The capacitance element 31 is connected in parallel to the IDT electrode 5. Specifically, for example, one bus bar 33a in the capacitance element 31 is connected to one bus bar 29a in the IDT electrode 5 through a connection line 17C as an example of the line 17, while the other bus bar 33a in the capacitance element 31 is connected to the other bus bar 29a in the IDT electrode 5 through the other connection line 17C. Note that, the capacitance element 31 and the IDT electrode 5 may be connected not through the bus bar 33a, but through the electrode fingers as well.

For example, one capacitance element 31 is provided for one IDT electrode 5. As explained above, when the plurality of IDT electrodes 5 configure a ladder type filter, the capacitance element 31 may be provided for each of the (one or plurality of) IDT electrodes 5 as a part thereof, may be provided for each of all IDT electrodes 5, may be provided for serial resonators, or may be provided for parallel resonators. Further, unlike the present embodiment, one capacitance element 31 may be commonly provided for two or more IDT electrodes 5 or a plurality of capacitance elements 31 may be provided for one IDT electrode 5.

Figure 4:
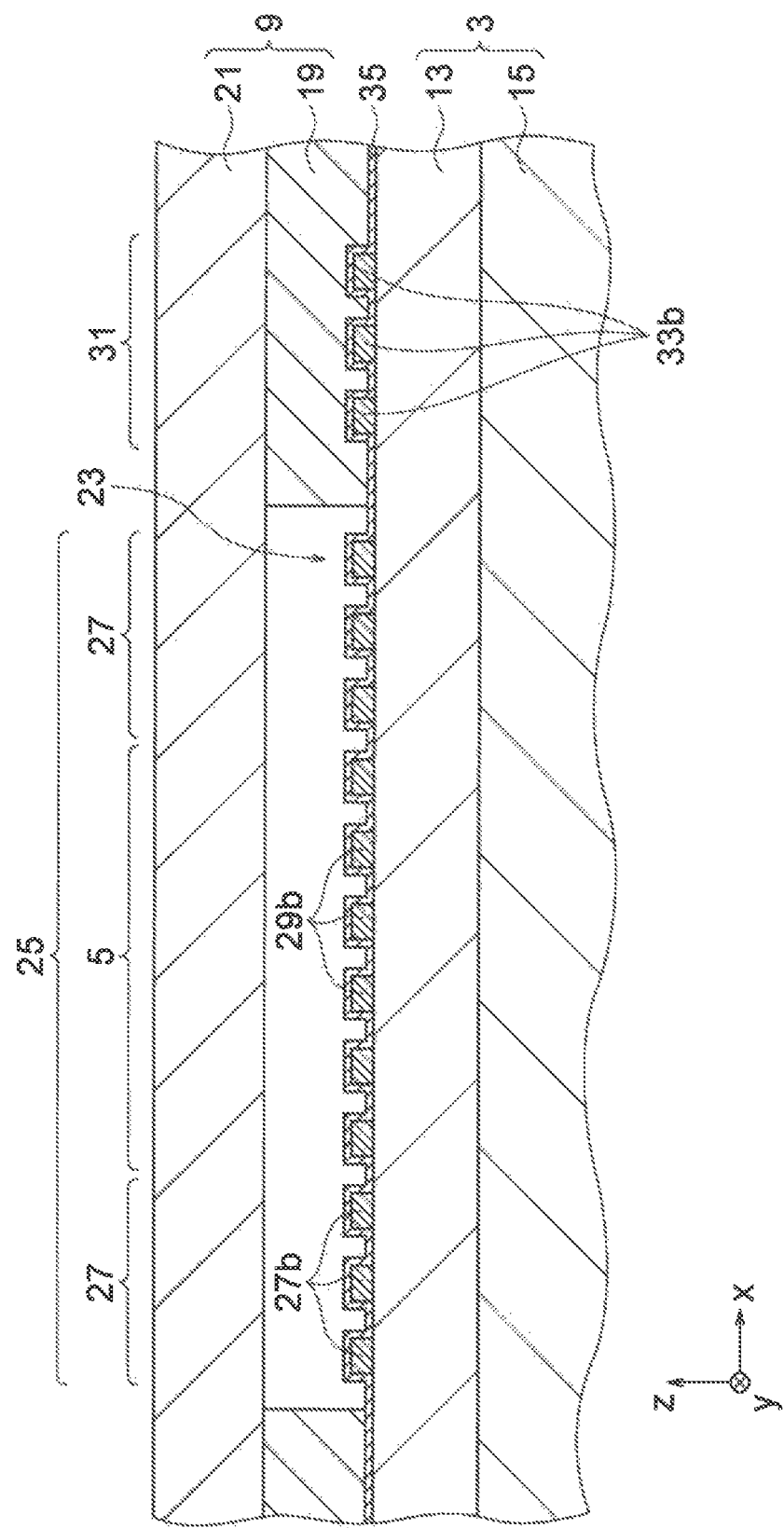
FIG. 4 is a cross-sectional view taken along the IV-IV line in FIG. 3.

FIG. 4 is a cross-sectional view taken along the IV-IV line in FIG. 3. Note that, for convenience of illustration, in FIG. 4, the number of electrode finger is decreased from that in FIG. 3.

On the first major surface 3a of the element substrate 3, a protective layer 35 is superimposed. The protective layer 35 for example contributes to prevention of oxidation of the conductive layer or the like, and covers the SAW resonator 25, capacitance element 31, lines 17 (FIG. 1), and so on. Note that, a portion of the lines 17 may be provided on the protective layer 35 as well. Further, the pads 7 (FIG. 1) are exposed from the protective layer 35 by formation of openings in the protective layer 35. The cover 9 is superimposed on the protective layer 35.

The protective layer 35 is for example formed by silicon oxide ($SiO_2$ etc.), aluminum oxide, zinc oxide, titanium oxide, silicon nitride, or silicon. The thickness of the protective layer 35 is for example about 1/10 of the thickness of the IDT electrode 5 (10 to 30 nm). By the protective layer 35 being formed relatively thin in this way, the excitation and propagation of the SAW are facilitated.

As shown in FIG. 3 and FIG. 4, the vibration space 23 is positioned above the SAW resonator 25, while the frame 19 is superimposed on the capacitance element 31 through the protective layer 35. The frame 19 is for example superimposed on the entire capacitance element 31. However, the frame 19 may be superimposed on only a portion of the capacitance element 31 as well. Further, the protective layer 35 need not be provided on the capacitance element 31: The frame 19 may be directly superimposed on the capacitance element 31.

The method of production of the SAW device 1 having the above configuration may be the same method as the known method except for the specific shapes of the capacitance element 31 and frame 19 and so on.

For example, first, a wafer from which a large number of element substrate 3 can be obtained is prepared. Next, a film of a conductive material is formed through a mask or a film of a conductive material is etched through a mask so as to form a conductive layer of the SAW resonator 25, capacitance element 31, lines 17, and pads 7 etc. on the first major surface 3a of the element substrate 3. Next, a film made of a material which becomes the protective layer 35 is formed through a mask or a film of a material which becomes the protective layer 35 is etched through a mask to form the protective layer 35.

Next, a thin film made of a photosensitive resin for forming the frame 19 is formed. The thin film is for example formed by adhesion of a film. Note that, the thin film which becomes the frame 19 may be formed by CVD (chemical vapor deposition) or spin coating or the like. After a thin film is formed, photolithography or the like is used to remove portions of the thin film and form openings for forming the vibration spaces 23 and openings for exposing the pads 7 etc.

Next, a thin film made of photosensitive resin which becomes the lid 21 is formed. The thin film is for example formed by adhesion of a film in the same way as the frame 19. After the thin film is formed, photolithography or the like is used to remove portions of the thin film and form notches for exposing the pads 7 and so on. After that, the SAW device 1 is cut from the wafer.

As described above, in the present embodiment, the SAW device 1 has the piezoelectric substrate 13, an IDT electrode 5 (excitation electrode) positioned on the major surface (first major surface 3a) of the piezoelectric substrate 13, a capacitance element 31 positioned on the first major surface 3a and connected parallel to the IDT electrode 5, and an insulator (cover 9) which is superimposed only on the capacitance element 31 between the IDT electrode 5 and the capacitance element 31.

Accordingly, even if voltage is applied to the piezoelectric substrate 13 by the capacitance element 31, in the region superimposed on the capacitance element 31, deformation of the piezoelectric substrate 13 is suppressed by the cover 9, consequently the generation of an acoustic wave (for example SAW) is suppressed. As a result, resonance through the acoustic wave of the capacitance element 31 is suppressed, and a drop in characteristics of the SAW device 1 by the resonance through the acoustic wave of the capacitance element 31 is suppressed. Specifically, for example, spurious emission due to the capacitance element 31 is reduced. As a result, for example, the insertion loss of the SAW resonator 25 is reduced.

Further, in the present embodiment, the insulator (cover 9) has the frame 19 which surrounds the IDT electrode 5 and is superimposed on the capacitance element 31 and the lid 21 which closes the openings of the frame 19.

Accordingly, by the cover 9 configuring the vibration spaces 23 for making the propagation of SAW suitable, the resonance of the capacitance element 31 will be suppressed. That is, it is not necessary to newly provide a member in order to suppress the resonance of the capacitance element 31, therefore reduction of size and reduction of manufacturing cost are achieved.

Further, in the present embodiment, the capacitance element 31 is configured by a pair of comb-shaped electrodes (capacitance electrodes 33) having pluralities of electrode fingers 33b which extend in parallel and are arranged so that the pluralities of electrode fingers 33b cross each other.

In such a capacitance element 31, as already explained, the capacity is easily secured, while resonance is easily generated. However, the resonance is suppressed by the frame 19, therefore a SAW device 1 which is reduced in size and has suitable characteristics as a whole is obtained. In other words, the effect of superimposing the frame 19 on the capacitance element 31 is more effectively exerted.

Further, in the present embodiment, the IDT electrode 5 is configured by a pair of comb-shaped electrodes 29 having parallel-extending pluralities of electrode fingers 29b arranged so that the pluralities of electrode fingers 29b cross each other. The angle of the pluralities of electrode fingers 33b in the capacitance element 31 relative to the pluralities of electrode fingers 29b in the IDT electrode 5 is 0° or more and less than 90° (0° in the present embodiment).

Accordingly, compared with the case where the above angle is 90°, the insertion loss of the SAW device 1 due to the provision of the capacitance element 31 is reduced. This effect was found by the simulation and measurement results by the applicant. As the reason why such an effect is exhibited, the following matters can be mentioned. The cutting angle of the piezoelectric substrate 13 and the direction of extension of the electrode fingers 29b in the IDT electrode 5 with respect to this are selected so that the SAW is suitably propagated. Accordingly, if the pluralities of electrode fingers 33b in the capacitance element 31 extend in a direction perpendicular to the electrode fingers 29b in the IDT electrode 5, the capacitance element 31 will apply an electric field in the direction giving the largest loss with respect to the piezoelectric substrate 13. From this fact, the loss is reduced so far as the angle formed by the electrode fingers 33b in the capacitance element 31 relative to the electrode fingers 29b in the IDT electrode 5 is less than 90°.

However, if the angle is less than 90°, while the loss is decreased, the piezoelectric substrate 13 becomes easier to deform by the electric field which is applied by the capacitance element 31 to the piezoelectric substrate 13. As a result, resonance occurs more easily through the acoustic wave by the capacitance element 31, and for example spurious emission is generated in the capacitance element 31. However, in the present embodiment, the resonance through the acoustic wave by the capacitance element 31 is suppressed by the cover 9, therefore the spurious emission can be reduced while reducing the insertion loss due to the angle being less than 90°. As a whole, a SAW device 1 excellent in electrical characteristics is obtained.

Note that, the above effect of reduction of the insertion loss is, as described above, due to the reduction of formation of the electric field in the direction of generation of loss. Therefore, the smaller the above angle, the larger the effect. This is confirmed also by simulation and measurement results by the applicant. Further, in the present embodiment, the angle is 45° or less (0°), therefore the insertion loss is reduced more.

Further, in the present embodiment, the SAW device 1 further has the support substrate 15 which is adhered to the piezoelectric substrate 13.

When the piezoelectric substrate 13 is adhered to the support substrate 15 in this way, the strength of the element substrate 3 is obtained by the support substrate 15 and so on. Therefore, the piezoelectric substrate 13 is formed relatively thin. For example, compared with the case where the element substrate is configured only by the piezoelectric substrate unlike the present embodiment (this case is also included in the invention of the present application), the thickness of the piezoelectric substrate 13 is controlled to about 1/10. As a result, a bulk wave generated on the piezoelectric substrate 13 is not scattered on the piezoelectric substrate 13, but is reflected at the interface between the piezoelectric substrate 13 and the support substrate 15 and thereby forms a standing wave. Accordingly, in the capacitance element 31 as well, resonance through the bulk wave will be generated, therefore spurious emission is generated. However, in the present embodiment, the deformation of the piezoelectric substrate 13 due to the electric field of the capacitance element 31 is suppressed by the insulator (cover 9), therefore the spurious emission is reduced. That is, when a stacked substrate is used, the effect of reduction of the spurious emission in the capacitance element 31 by the insulator is effectively exerted.

Second Embodiment

Figure 5:
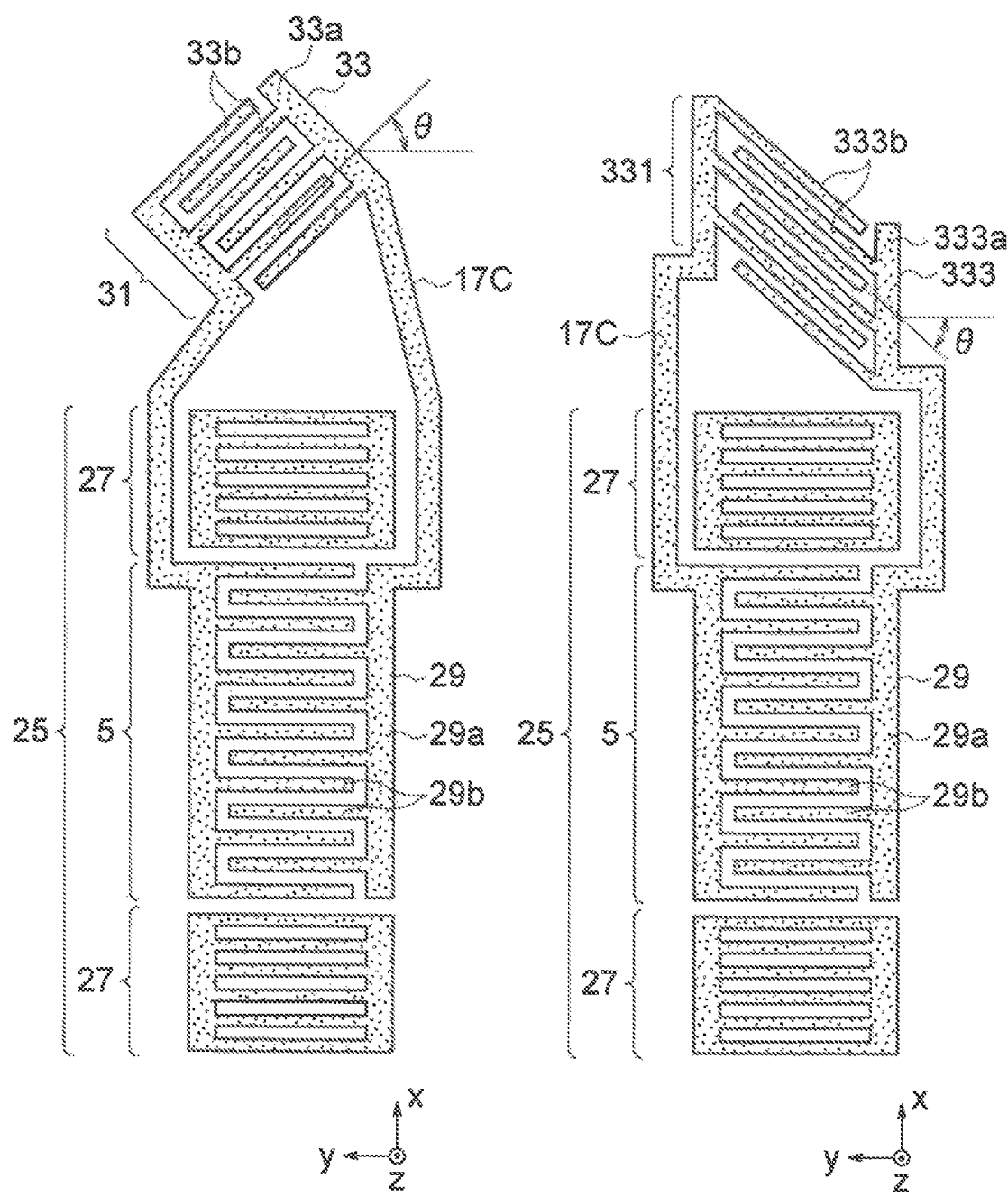
FIG. 5A and FIG. 5B are plan views showing SAW resonators and capacitance elements according to second and third embodiments.

FIG. 5A is a plan view showing the SAW resonator 25 and capacitance element 31 in a SAW device in a second embodiment.

The second embodiment is different from the first embodiment only in the orientation of the capacitance element 31. That is, in the second embodiment, the capacitance element 31 is arranged so that the angle θ of its electrode fingers 33b relative to the electrode fingers 29b in the IDT electrode 5 becomes one exceeding 0° and less than 90°. In other words, the electrode fingers 33b are inclined relative to the electrode fingers 29b. Further, the bus bars 33a in the capacitance element 31 are also inclined relative to the bus bars 29a in the IDT electrode 5 at the same angle as the angle formed by the electrode fingers 33b and the electrode fingers 29b.

As already explained, as the angle θ becomes smaller, the insertion loss by the capacitance element 31 is reduced more while the spurious emission becomes larger. That is, in relation to the change of the angle θ, there is a trade-off between the reduction of insertion loss and the reduction of spurious emission. Therefore, depending on the configuration of the SAW device 1 as a whole or the configuration of the SAW resonator 25 as a whole, characteristics closest to the desired characteristics as a whole are obtained by setting the angle θ at a suitable value which exceeds 0° and is less than 90°.

For example, unlike the embodiments, in a case where an insulator (cover 9) is not superimposed on the capacitance element 31, in the simulation and measurement results by the applicant, at approximately 45°, a suitable SAW device having a balance of reduction of insertion loss and reduction of spurious emission was obtained. Note that, in the case where the insulator is superimposed on the capacitance element 31, the spurious emission is reduced by the insulator. Therefore, as illustrated in the first embodiment, suitable characteristics are obtained when the angle θ is around 0°.

Third Embodiment

FIG. 5B is a plan view showing a SAW resonator 25 and capacitance element 331 in a SAW device in a third embodiment.

The third embodiment is different from the first embodiment in the point that, in the same way as the second embodiment, electrode fingers 333b in the capacitance element 331 (capacitance electrode 333) are inclined relative to the electrode fingers 29b in the IDT electrode 5. However, in the third embodiment, bus bars 333a in the capacitance element 331 are parallel to the bus bars 29a in the IDT electrode 5 unlike the second embodiment. From another viewpoint, the third embodiment is different from the first embodiment in the point that the electrode fingers 333b in the capacitance element 331 extend with an inclination relative to the facing direction (y-direction) of the bus bars 333a in the capacitance element 331.

In this configuration, first, the electrode fingers 333b in the capacitance element 331 are inclined relative to the electrode fingers 29b in the IDT electrode 5, therefore, in the same way as the second embodiment, both reduction of insertion loss and reduction of spurious are exhibited. Note that, the angle may be suitably set within a range exceeding 0° and less than 90° or a range exceeding 0° and less than 45° in the same way as the second embodiment.

Further, in the capacitance element 331, the electrode fingers 333b are inclined relative to the bus bars 333a, therefore a standing wave is hardly ever formed over the plurality of electrode fingers 333b, so resonance through an acoustic wave is suppressed. In the simulation and measurement results by the applicant, it is confirmed that, between the second embodiment and the third embodiment, even if the angles θ are the same as each other, the spurious emission can be reduced more in the third embodiment than that in the second embodiment.

Note that, although not particularly shown, while keeping the characteristic feature that the electrode fingers 333b in the capacitance element 331 are inclined relative to the bus bars 333a, unlike the present embodiment, the bus bars 333a may be inclined or perpendicular with respect to the bus bars 29a in the IDT electrode 5 as well. In this case, the electrode fingers 333b may be inclined relative to the electrode fingers 29b in the IDT electrode 5 in the same way as the second embodiment, may be parallel in the same way as the first embodiment, or may be perpendicular unlike them.

When the mutually facing edge parts of the bus bars 333a which face each other form straight lines which are parallel to each other, the facing direction of the bus bars 333a can be defined by for example the direction perpendicular to the straight lines. When the mutually facing edge parts of the bus bars 333a are not parallel to each other due to a type of apodizing, the facing directions may be suitably set considering the overall shape of the bus bars 333a etc. and general technical knowledge.

Fourth Embodiment

Figure 6:
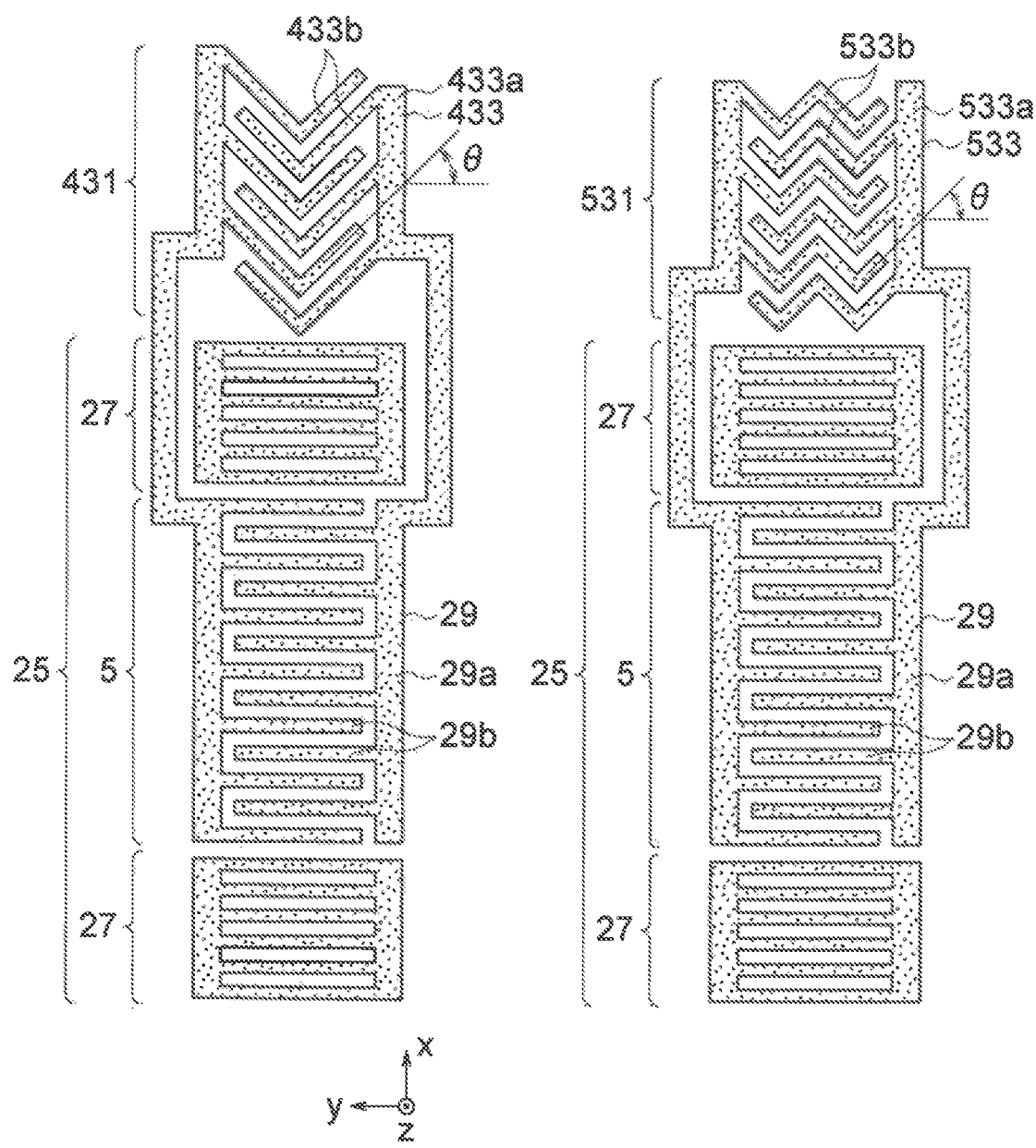
FIG. 6A and FIG. 6B are plan views showing SAW resonators and capacitance elements according to fourth and fifth embodiments.

FIG. 6A is a plan view showing a SAW resonator 25 and capacitance element 431 of a SAW device in a fourth embodiment.

The fourth embodiment differs from the first embodiment only in the shape of the capacitance element 431 (capacitance electrode 433). Specifically, the electrode fingers 433b in the capacitance element 431 are V-shaped. That is, the electrode fingers 433b are bent.

In this configuration, in the same way as the third embodiment, the electrode fingers 433b in the capacitance element 431 are inclined relative to the electrode fingers 29b in the IDT electrode 5, and the electrode fingers 433b in the capacitance element 431 extend with an inclination relative to the facing direction of the pair of bus bars 433a. Accordingly, in the same way as the third embodiment, both reduction of insertion loss and reduction of spurious emission are exhibited. In particular, this is effective for the reduction of spurious emission.

The angle of a V-shaped bent portion may be suitably set within a range exceeding 0° and less than 180° or a range exceeding 0° and less than 90°. The angle of the electrode fingers 433b in the capacitance element 431 relative to the electrode fingers 29b in the IDT electrode 5 may be suitably set within a range exceeding 0° and less than 90° or a range exceeding 0° and less than 45° in the same way as the second embodiment.

Although particularly not shown, while keeping the characteristic feature that the electrode fingers 433b are bent in the capacitance element 431, unlike the present embodiment, the bus bars 433a in the capacitance element 431 may be inclined or perpendicular with respect to the bus bars 29a in the IDT electrode 5. In this case, a portion of the electrode fingers 433b may be parallel or perpendicular to the electrode fingers 29b.

Fifth Embodiment

FIG. 6B is a plan view showing a SAW resonator 25 and capacitance element 531 in a SAW device in a fifth embodiment.

In the fifth embodiment, in the same way as the fourth embodiment, the electrode fingers 533b in the capacitance element 531 (capacitance electrode 533) are bent. However, the electrode fingers 433b in the fourth embodiment were V-shaped, while the electrode fingers 533b in the fifth direction are W-shaped.

According to the present embodiment, the same effects as those by the fourth embodiment are exhibited. However, according to the simulation results and measurement results by the applicant, the effect of reduction of spurious emission is higher in the fourth embodiment than that in the fifth embodiment. This is considered to be due to the fact that the electrode fingers 533b as a whole approach straight lines when the bent parts increase.

The angle of the bent parts may be suitably set within a range exceeding 0° and less than 180° or a range exceeding 0° and less than 90°, while the angles of the electrode fingers 533b in the capacitance element 531 relative to the electrode fingers 29b in the IDT electrode 5 may be suitably set within a range exceeding 0° and less than 90° or a range exceeding 0° and less than 45° in the same as the other embodiments.

Further, although not particularly shown, while keeping the characteristic feature that the electrode fingers 533b are bent in the capacitance element 531, unlike the present embodiment, the bus bars 533a in the capacitance element 531 may be inclined or perpendicular with respect to the bus bars 29a in the IDT electrode 5. In this case, a portion of the electrode fingers 533b may be parallel or perpendicular with respect to the electrode fingers 29b.

Sixth Embodiment

Figure 7:
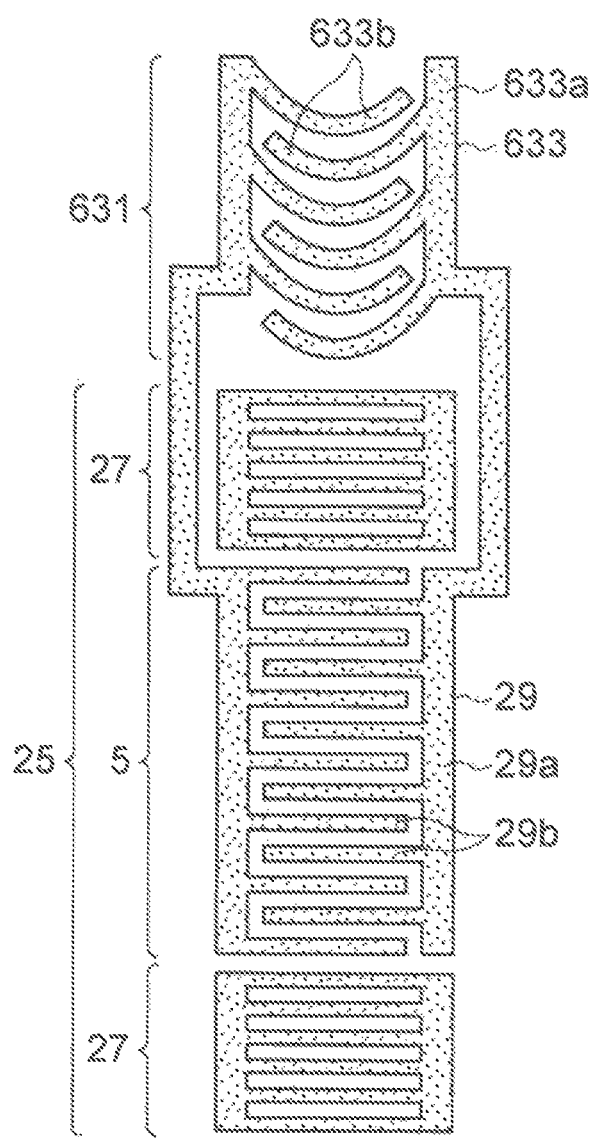
FIG. 7 is a plan view showing a SAW resonator and capacitance element according to a sixth embodiment.

FIG. 7 is a plan view showing a SAW resonator 25 and capacitance element 631 in a SAW device in a sixth embodiment.

The sixth embodiment differs from the first embodiment in only the point that the electrode fingers 633b in the capacitance element 631 (capacitance electrode 633) are curved. Even in such a configuration, the same effects as those by the fourth embodiment and fifth embodiment are exhibited.

Note that, the curvature of the curves may be constant or may vary. The curvature may be suitably set. A curve may be formed at part of an electrode finger 633b or in all of it. Further, although not particularly shown, while keeping the characteristic feature that the electrode fingers 633b are curved in the capacitance element 631, unlike the present embodiment, the bus bars 633a in the capacitance element 631 may be inclined or perpendicular with respect to the bus bars 29a in the IDT electrode 5.

Seventh Embodiment

Figure 8A:
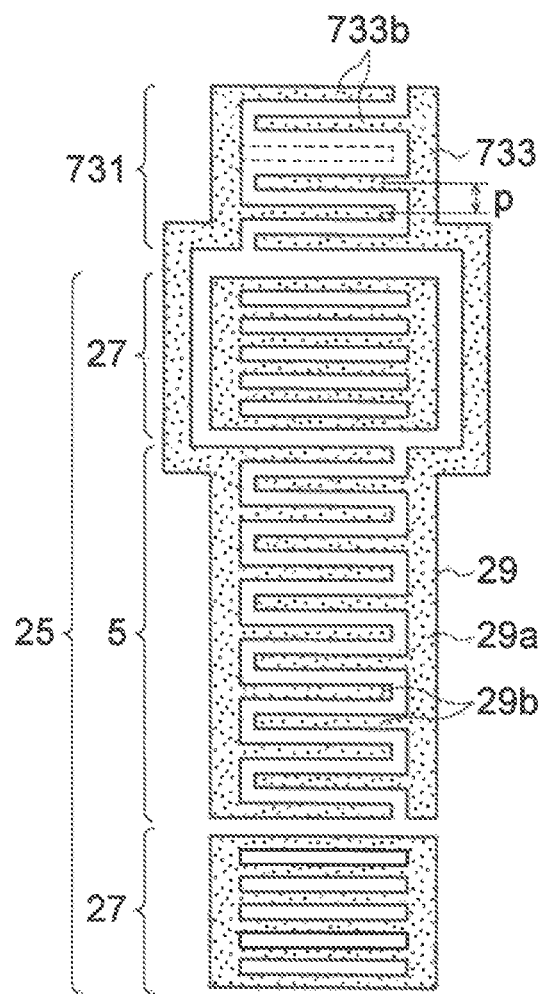
FIG. 8A and FIG. 8B are plan views showing SAW resonators and capacitance elements according to seventh and eighth embodiments.

FIG. 8A is a plan view showing a SAW resonator 25 and capacitance element 731 in a SAW device in a seventh embodiment.

The seventh embodiment differs from the first embodiment in the point that, in the capacitance element 731 (capacitance electrodes 733), among the pluralities of electrode fingers 733b arrayed with the constant pitch "p", part of the electrode fingers 733b (indicated by a dotted line) are thinned out. If explaining this more abstractly, in the seventh embodiment, regular continuity of the pluralities of electrode fingers 733b is partially interrupted. Note that, the number of the electrode fingers 733b etc. are suitably adjusted so that the capacity becomes the same before and after the thinning process.

The number of the electrode fingers 733b to be thinned out may be suitably set. For example, as exemplified in FIG. 8A, only one may be thinned out or two or more successive electrode fingers 733b may be thinned out or one or more electrode fingers 733b may be thinned out at two or more positions separated from each other.

Note that, in the example in FIG. 8A, by thinning out an odd number of (one) electrode fingers 733b, electrode fingers 733b which belong to the same capacitance electrode 733 as each other between the pair of capacitance electrodes 733 become adjacent to each other (at relatively wide intervals). On the other hand, in the capacitance element 731, basically, the electrode fingers 733b which belong to capacitance electrodes 733 different from each other are alternately arrayed. Accordingly, interruption of the regular continuity can be learned by the electrode fingers 733b adjoining each other belonging to the same capacitance electrode 733 as each other.

Further, although not particularly shown, in a case of thinning out an even number of electrode fingers 733b, electrode fingers 733b belonging to the capacitance electrodes 733 different from each other between the pair of capacitance electrodes 733 will be adjacent to each other (at relatively wide intervals). This can be grasped as a change of the pitch "p" of the plurality of electrode fingers 733b. Accordingly, interruption of the regular continuity can be learned by whether the pitch "p" locally changes.

Note that, as exemplified in FIG. 8A, in the case where the electrode fingers 733b are simply thinned out, the distances between the centers of the electrode fingers 733b in that thinned region become whole multiples of the pitch "p" in the other regions. However, this thinned region may also be suitably broadened or narrowed so as not to give whole multiples of the pitch "p". Even in such a case, as explained above, interruption of the regular continuity can be learned by whether the pitch "p" locally changes.

According to the configuration of the present embodiment, at a position where the electrode fingers 733b are thinned out, the acoustic wave is not reflected, therefore the possibility of formation of a standing wave due to the electric field of the capacitance element 31 is reduced. As a result, for example, spurious emission can be reduced.

Eighth Embodiment

Figure 8B:
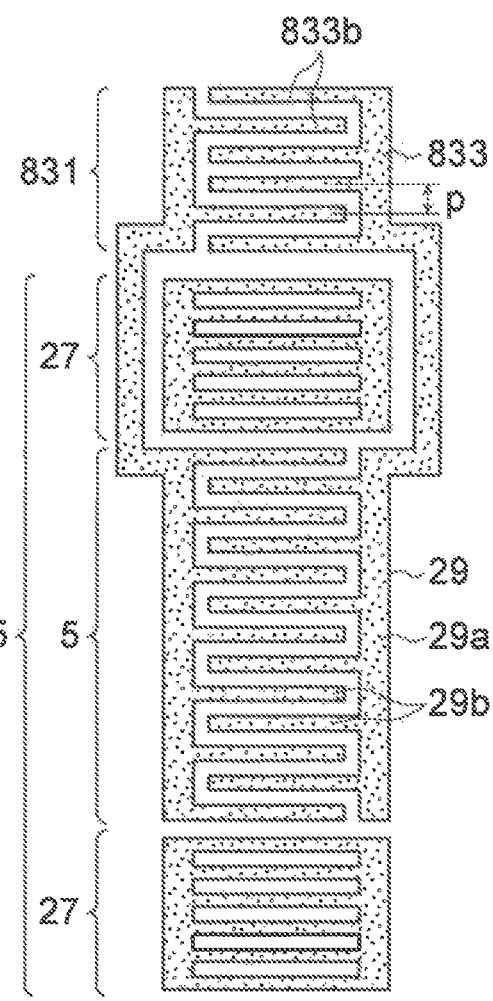

FIG. 8B is a plan view showing a SAW resonator 25 and capacitance element 831 in a SAW device in an eighth embodiment.

The capacitance element 831 (capacitance electrodes 833) in the eighth embodiment is configured so that the regular continuity of the electrode fingers 833b is interrupted in the same way as the capacitance element 731 in the seventh embodiment. However, in the eighth embodiment, the pitch "p" of the electrode fingers 833b is constant but at parts, two electrode fingers 833b belonging to the same capacitance electrode 833 are adjacent to each other. Outside of these two electrode fingers 833b, for example, the regularity is maintained for a certain extent of length. From another viewpoint, on the middle of the array of the electrode fingers 833b, the polarity of the voltage is inverted.

In such a configuration, between one side and the other side of the direction of arrangement of the electrode fingers 833b at the boundary of the two electrode fingers 833b which belong to the same capacitance electrode 833 and are adjacent to each other, the phases of the standing waves become inverse. As a result, the standing waves are canceled out by each other at the position of these two electrode fingers 833b, therefore the resonance in the capacitance element 831 is reduced and consequently the spurious emission is reduced.

Note that, two electrode fingers 833b that belong to the same capacitance electrode 833 and are adjacent to each other may be provided at one point or may be provided at two or more points. However, preferably they are provided so that the acoustic waves is suitably canceled out. For example, if at one point, the center of the capacitance element 831 is preferable. Further, three of more electrode fingers 833b belonging to the same capacitance electrode 833 may be consecutively provided as well.

Ninth Embodiment

FIG. 9A is a plan view showing a SAW resonator 25 and capacitance element 931 in a SAW device in a ninth embodiment.

A capacitance element 931 (capacitance electrodes 933) in the ninth embodiment, in the same way the capacitance element 831 in the eighth embodiment, is configured so that the regular continuity of the electrode fingers 933b is interrupted and the acoustic waves are canceled by each other at that interrupted position.

However, in the ninth embodiment, by keeping the configuration of alternately arranging electrode fingers 933b which belong to capacitance electrodes 933 different from each other and making the pitch of a portion two times (2p) the pitch "p" of the other, the effect of cancelling the acoustic waves is realized. Note that, the ninth embodiment can be grasped also as one where one of the two electrode fingers 833b which belong to the same capacitance electrode 833 as each other and are adjacent to each other in the eighth embodiment is eliminated. However, the number of the electrode fingers 933b is maintained so as to keep the same capacity.

The ninth embodiment is characterized in that the pitch changes in a portion of the capacitance element 931 and in that the regular continuity of the electrode fingers 933b is interrupted by this. FIG. 9A exemplified the case where the changed pitch was 2p as the example of suitably cancelling the acoustic waves by each other. However, the changed pitch is not limited to 2p. For example, it may be less than 1p or may exceed 1p or exceed 2p. In any case, the formation of a standing wave is reduced.

The portion where the pitch changes may be provided at one point or may be provided at a plurality of points. However, it is preferably provided so that the acoustic waves are suitably canceled out. For example, if the portion where the pitch changes is provided only at one point and that changed pitch is 2p, the center of the capacitance element 931 is preferable.

Further, the change of the pitch need not be set in just a part of the capacitance element 931, but may be set in the whole. In this case, compared with the case where the pitch changes in one part, the formation of a standing wave is reduced more. However, calculation of the capacity and impedance of the capacitance element 931 (design of the capacitance element 931) becomes troublesome.

10th Embodiment

FIG. 9B is a plan view showing a SAW resonator 25 and capacitance element 1031 (capacitance electrode 1033) in a SAW device in a 10th embodiment.

In the capacitance element 1031 (capacitance electrodes 1033) in the 10th embodiment, in the same way as the capacitance elements in another embodiments, the regular continuity of the electrode fingers 1033b is interrupted. Specifically, the duty ratio changes in one part.

The duty ratio is for example the ratio of an electrode finger 1033b in the pitch "p" and is represented by w/p where the width of the electrode finger 1033b is "w". From another viewpoint, the change of the duty ratio is the change of the width of the electrode finger 1033b.

By the change of the duty ratio, in an electrode finger 1033b changed in duty ratio, the phase and wavelength of the induced acoustic wave and the reflection position of the propagated acoustic wave deviate relative to other electrode fingers 1033b. As a result, the formation of a standing wave is reduced. Further, the resonance in the capacitance element 1031 is reduced and consequently the spurious emission is reduced.

FIG. 9B shows an example in which the width of the electrode finger 1033b in one part is made broader and the duty ratio changes. Note, conversely to this, the width of the electrode finger 1033b in one part may be narrowed, and the duty ratio may change. Also, the degree of change of the duty ratio may be suitably set. In any case, the formation of a standing wave is reduced.

Note that, the part where the duty ratio changes may be provided at one point or may be provided at a plurality of points. Further, the change of the duty ratio may be set not in part of the capacitance element 1031, but in the whole. In this case, compared with the case where the duty ratio changes in one part, the formation of a standing wave is reduced more. Note, the calculation of the capacity and impedance of the capacitance element 1031 (design of the capacitance element 1031) becomes troublesome.

Below, the mode of operation of the present embodiment will be explained. The applicant performed various simulations, prepared samples of various embodiments, and measured characteristics of them. However, it is difficult to show all of the results in detail. Therefore, the drawings shown below will show the measurement results in an abstract manner or with omission of details so that the characteristics common to the plurality of embodiments can be explained qualitatively.

Figure 10A:
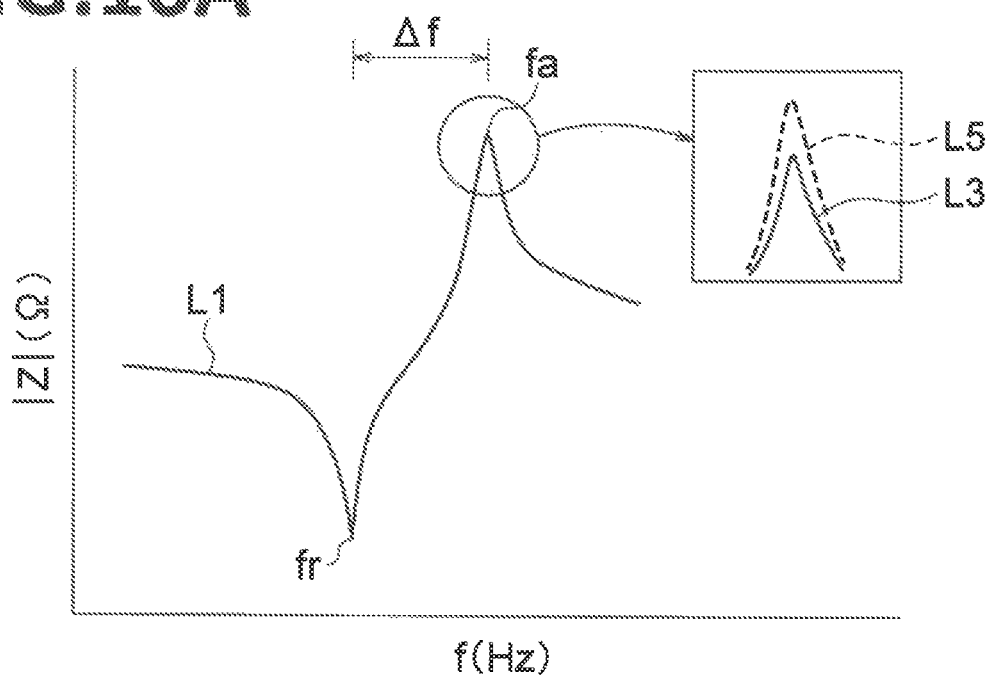
FIG. 10A and FIG. 10B are schematic views showing impedance characteristics of a SAW resonator in which a capacitance element is connected in parallel.
Figure 10B:
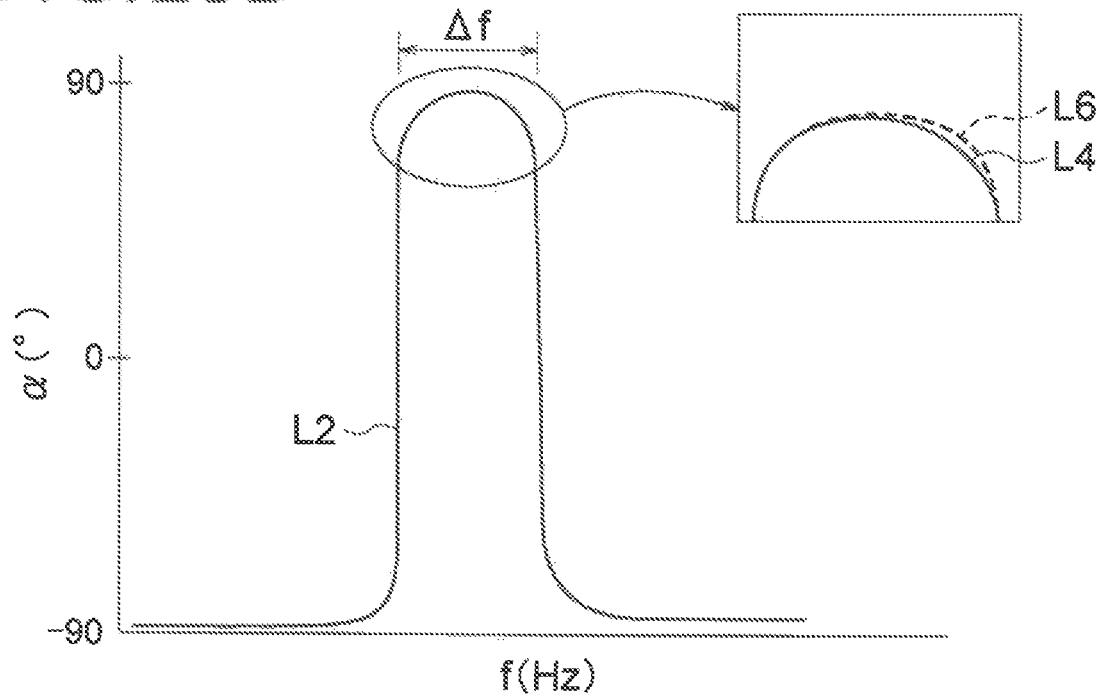

FIG. 10A and FIG. 10B are schematic views showing the impedance characteristics of a SAW resonator 25 to which a capacitance element is connected parallel. In FIG. 10A and FIG. 10B, the abscissas show frequencies "f" (Hz). In FIG. 10A, the ordinate shows an absolute value $|Z|$ ($\Omega$) of the impedance Z of the SAW resonator 25. In FIG. 10B, the ordinate shows the phase $\alpha$ (°) of the impedance Z of the SAW resonator 25.

As indicated by a solid line L1 in FIG. 10A, in the SAW resonator 25, a resonance point (resonance frequency fr) at which the absolute value $|Z|$ takes the minimum value and an antiresonance point (antiresonance frequency fa) at which the absolute value $|Z|$ takes the maximum value appear. Further, as indicated by a solid line L2 in FIG. 10B, the phase $\alpha$ approaches 90° between the resonance frequency fr and the antiresonance frequency fa.

When a capacitance element is provided, for example, a frequency difference $\Delta f$ (fa−fb) between the resonance frequency fr and the antiresonance frequency fa becomes small. If the filter (for example, a ladder type filter) is configured by using the SAW resonator 25 given the frequency difference $\Delta f$ made small, a steep shoulder characteristic is obtained.

Here, on the right top in each of FIG. 10A and FIG. 10B, a partially enlarged diagram of the impedance characteristic of the SAW resonator 25 is shown. A solid line L3 (FIG. 10A) and solid line L4 (FIG. 10B) show impedance characteristics in a case (comparative example) where the capacitance element is provided so that the facing direction of the bus bars in the capacitance element and the facing direction of the bus bars in the IDT electrode 5 are perpendicular and where the measures of reducing the resonance of the capacitance element shown in the first to 10th embodiments are not taken at all. A dotted line L5 (FIG. 10A) and dotted line L6 (FIG. 10B) show impedance characteristics in a case where the capacitance elements in the first to 10th embodiments are provided.

As shown in FIG. 10A, in the embodiments, the absolute value $|Z|$ at the antiresonance point becomes larger compared with the comparative example. Although not particularly shown, at the resonance point, conversely the absolute value $|Z|$ at the resonance point becomes small. From another viewpoint, in the embodiments, the Q value becomes larger compared with the comparative example. Further, as shown in FIG. 10B, in the embodiments, compared with the comparative example, the phase $\alpha$ approaches 90°. In particular, in the measurement results of the applicant, the difference between the embodiments and comparative example became large on a high frequency side in the range of the frequency difference $\Delta f$.

In this way, in the embodiments, compared with the comparative example, the resonance characteristic of the SAW resonator 25 is improved due to the reduction of loss and reduction of resonance (spurious emission) in the capacitance element. By configuring the filter by using such a SAW resonator 25, the pass characteristics of the filter are improved.

Figure 11A:
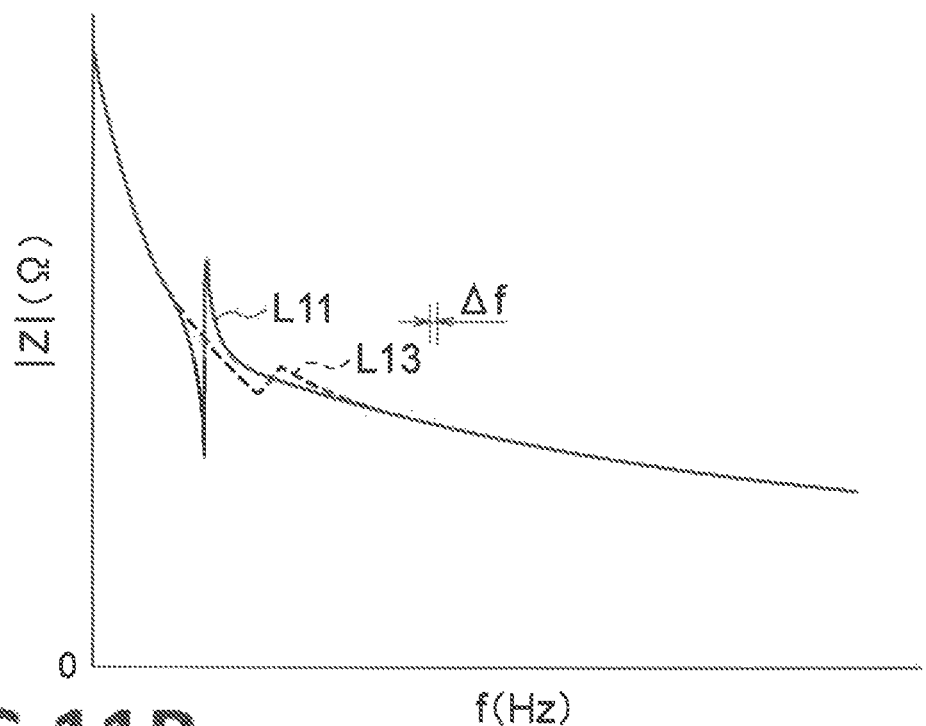
FIG. 11A and FIG. 11B are schematic views showing impedance characteristics of capacitance elements.
Figure 11B:
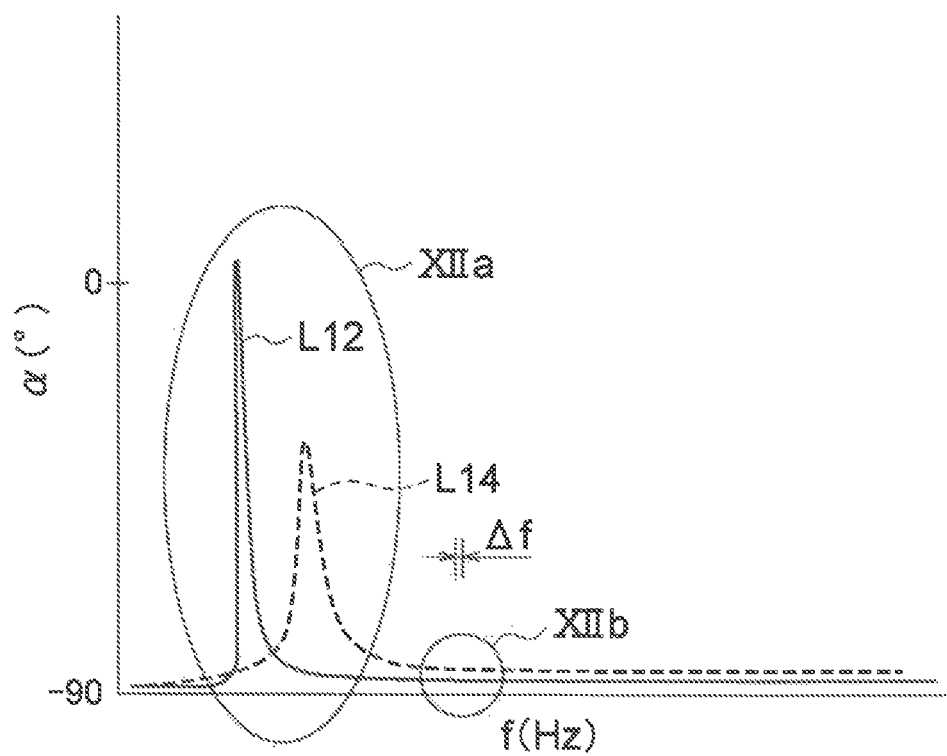

FIG. 11A and FIG. 11B are schematic views showing impedance characteristics of the capacitance element. The abscissas (frequency "f" (Hz)) in FIG. 11A and FIG. 11B, the ordinate (absolute value $|Z|$ ($\Omega$)) in FIG. 11A, and the ordinate (phase $\alpha$ (°)) in FIG. 11B are as already explained. The scales of the ordinates and abscissas in FIG. 11A and FIG. 11B are different from those in FIG. 10A and FIG. 10B. FIG. 11A and FIG. 11B show the frequency differences $\Delta f$ explained with reference to FIG. 10A and FIG. 10B.

In FIG. 11A and FIG. 11B, solid lines L11 (FIG. 11A) and L12 (FIG. 11B) show impedance characteristics in a case where the capacitance element is provided so that the facing direction of the bus bars in the capacitance element and the facing direction of the bus bars in the IDT electrode 5 match and where the measures of reducing the resonance (spurious emission) of the capacitance element (arrangement of insulator, inclination of electrode fingers, discontinuity of electrode fingers, and so on) are not taken (Comparative Example 1: aspect in which an insulator is not provided on the capacitance element in the first embodiment). Dotted lines L13 (FIG. 11A) and L14 (FIG. 11B) show impedance characteristics in a case where the capacitance element is provided so that the facing direction of the bus bars in the capacitance element and the facing direction of the bus bars in the IDT electrode 5 are perpendicular to each other and where the other matters are the same as in Comparative Example 1 (Comparative Example 2).

As shown in FIG. 11A, the absolute value $|Z|$ of the capacitance element falls more as a whole as the frequency becomes higher. Note, out of the band of the SAW resonator 25 (outside of $\Delta f$, more specifically, a low frequency side in this example), the absolute value $|Z|$ fluctuates. Further, as shown in FIG. 11B, the phase $\alpha$ of the capacitance element becomes a constant value close to −90° as a whole. Note, at the frequency at which fluctuation of the absolute value $|Z|$ occurs as described above, the phase $\alpha$ becomes large.

This is caused by occurrence of resonance through the SAW in the capacitance element. Note that, this resonance is a resonance different from the resonance generated in the SAW resonator 25, therefore this resonance will be conveniently referred to as "sub-resonance".

The frequency of occurrence of the sub-resonance is lower in the aspect in which the orientation of the capacitance electrodes and the orientation of the IDT electrode (excitation electrode) are the same (Comparative Example 1) than that in the aspect in which the orientation of the capacitance electrodes and the orientation of the IDT electrode are perpendicular to each other. Further, the peak of the spurious emission due to the sub-resonance is larger in the former than that in the latter. As already explained, the insertion loss due to the capacitance elements is smaller in the former than that in the latter. In this way, for the orientation of the capacitance elements, there is a tradeoff between the insertion loss and the spurious emission in the sub-resonance.

FIG. 12A is a enlarged view of a region XIIa in FIG. 11B. FIG. 12B is a enlarged view of a region XIIb in FIG. 11B.

The solid line L12 and solid line L14 are the same as those in FIG. 11B. A one-dotted chain line L15 indicates the impedance characteristic in a case where, with respect to Comparative Example 1 indicated by the solid line L12, the measure of reducing the resonance of the capacitance element (arrangement of insulator, inclination of electrode fingers, discontinuity of electrode fingers, or the like) is applied (Example 1). A two-dotted chain line L16 indicates the impedance characteristic in a case where, with respect to Comparative Example 2 indicated by the dotted line L14, the measure of reducing the resonance of the capacitance element is applied (Example 2: a case where the capacitance element is provided so that the facing direction of the bus bars in the capacitance element and the facing direction of the bus bars in the IDT electrode 5 are perpendicular to each other and the rest of the matters are the same as in Example 1).

As shown in FIG. 12A, by a measure of reducing the resonance of the capacitance element such as arrangement of an insulator, inclination of the electrode fingers, or discontinuity of the electrode fingers, the peak of spurious emission of sub-resonance is reduced. This measure exerts almost no influence upon the frequency at which the sub-resonance is generated. Note, although not particularly shown, in the case where the electrode fingers are W-shaped, two peaks appeared although the peak became low.

As shown in FIG. 12B, when the frequency difference of the SAW resonator 25 is Δf and in the vicinity thereof, a spurious emission which is relatively very small and is relatively cyclic is generated. This is because a resonance through a bulk wave is generated due to the formation of the element substrate 3 as the stacked substrate.

As understood from the comparison of the solid line L12 and the dotted line L14, the peak or amplitude of the spurious by the bulk wave becomes smaller as the facing direction of the bus bars in the capacitance element matches more the facing direction of the bus bars 29a in the IDT electrode 5 compared with the case where they are perpendicular to each other. Further, as a whole, the phase α is closer to −90° in the former than that in the latter. Accordingly, the insertion loss is smaller in the former than that in the latter.

As understood by comparing the one-dotted chain line L15 and the two-dotted chain line L16 with the solid line L12 and the dotted line L14, by the measure of reducing the resonance of the capacitance element such as arrangement of an insulator, inclination of electrode fingers, or discontinuity of electrode fingers, the peak or amplitude of the spurious emission when the frequency difference is Δf and in the vicinity thereof becomes small. Due to this, the resonance characteristic of the SAW resonator 25 is improved. Note that, the insertion loss is not influenced so much according to presence/absence of a measure of reducing the resonance.

<Example of Use of SAW Device>

(Duplexer)

Figure 13:
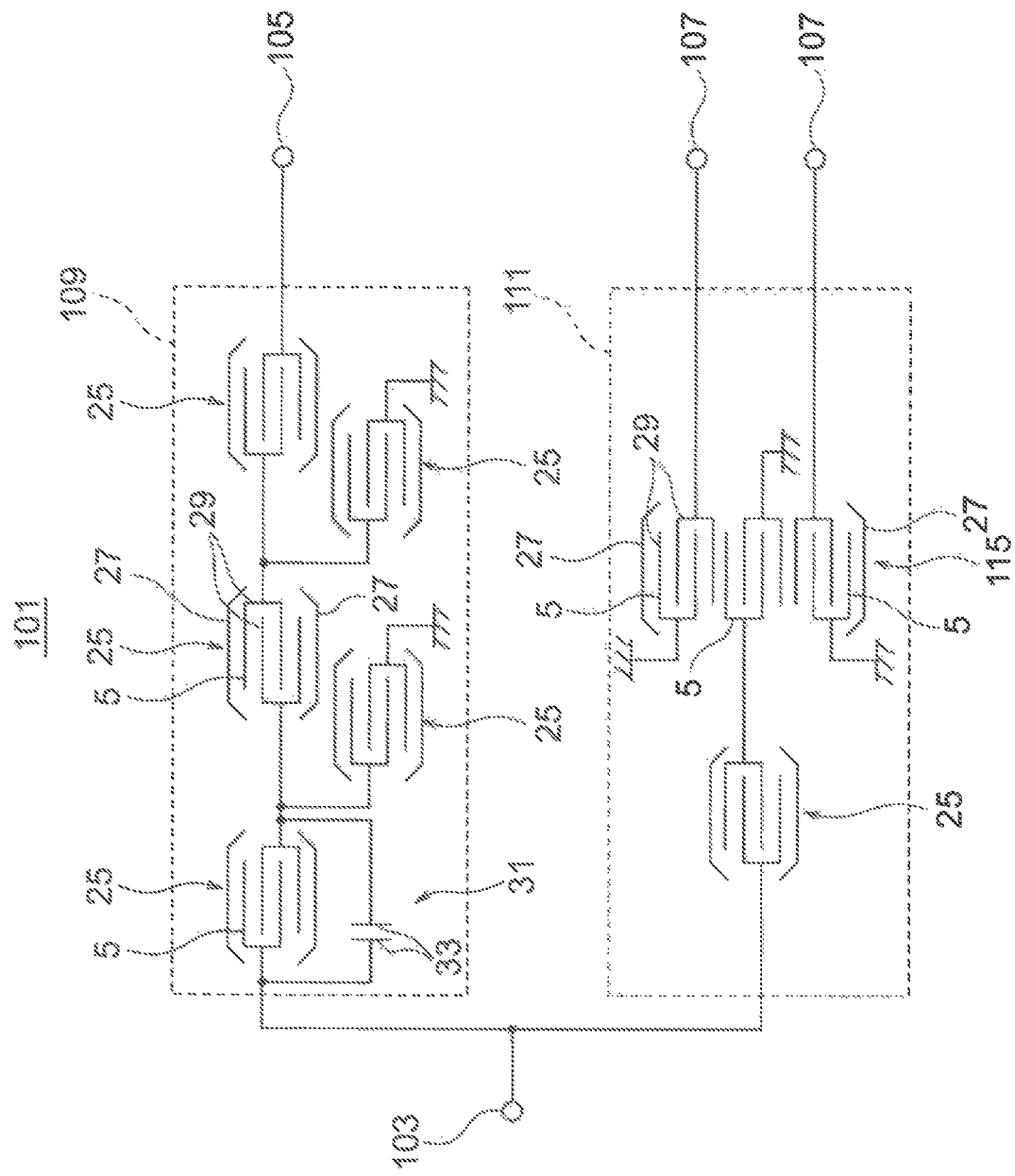
FIG. 13 is a schematic view showing a duplexer as an example of use of a SAW device.

FIG. 13 is a schematic view showing a duplexer 101 as an example of use of the SAW device 1.

The duplexer 101 for example has a transmission filter 109 which filters a transmission signal from a transmission terminal 105 and outputs the result to an antenna terminal 103 and has a receiving filter 111 which filters a reception signal from the antenna terminal 103 and outputs the result to a pair of reception terminals 107.

The transmission filter 109 is for example configured by a ladder type filter. That is, a plurality of SAW resonators 25 are connected in series and are connected in parallel. Note that, the IDT electrodes 5 and pairs of reflectors 27 configuring the plurality of SAW resonators 25 are for example provided on the same element substrate 3 (not shown in FIG. 13).

The receiving filter 111 is for example configured by a SAW resonator 25 and a SAW filter 115 which are connected in series to each other. The IDT electrodes 5 and pairs of reflectors 27 configuring them are for example provided on the same element substrate 3. This element substrate 3 may be the same as the element substrate 3 for forming the transmission filter 109 or may be different from the latter.

The SAW filter 115 is for example a vertically coupled multiplex mode (including double mode) type SAW filter and has a plurality of IDT electrodes 5 arranged in the propagation direction of the SAW and a pair of reflectors 27 arranged on the two sides of the same.

The capacitance element 31 may be provided with respect to any IDT electrode 5 in the duplexer 101 as well. In the shown example, the capacitance element 31 is provided with respect to the IDT electrode 5 of the serial resonator at the side nearest the antenna terminal 103. Note that, use is made of the notation shown in the first embodiment as the notation of the capacitance element, but a capacitance element in another embodiment may be provided as well.

(Communication Apparatus)

FIG. 14 is a block diagram showing a principal part of a communication apparatus 151 having the duplexer 101. The communication apparatus 151 performs wireless communication utilizing radio waves.

In the communication apparatus 151, a transmission information signal TIS containing the information to be transmitted is modulated and boosted up in frequency (converted to a high frequency signal in carrier frequency) by the RF-IC (radio frequency integrated circuit) 153 to become the transmission signal TS. The transmission signal TS is stripped of unnecessary components out of the transmission-use passband by a bandpass filter 155, amplified by an amplifier 157, and is input to the duplexer 101 (transmission terminal 105). Further, the duplexer 101 strips the unnecessary components out of the transmission-use passband from the input transmission signal TS and outputs the transmission signal TS after that from the antenna terminal 103 to the antenna 159. The antenna 159 converts the input electrical signal (transmission signal TS) to a wireless signal (radio wave) and transmits the result.

Further, in the communication apparatus 151, the wireless signal (radio wave) received by the antenna 159 is converted to an electrical signal (reception signal RS) by the antenna 159 and is input to the duplexer 101. The duplexer 101 strips the unnecessary components out of a reception-use passband from the input reception signal RS and outputs the result to an amplifier 161. The output reception signal RS is amplified by the amplifier 161 and is stripped of the unnecessary components out of the reception-use passband by a bandpass filter 163. Further, the reception signal RS is boosted down in frequency and demodulated by the RF-IC 153 to become a receiving information signal RIS.

Note that, the transmission information signal TIS and receiving information signal RIS may be low frequency signals (baseband signals) containing suitable information and for example analog audio signals or digital audio signals. The passband of the wireless signal may be one based on various standards such as the UMTS (Universal Mobile Telecommunications System). The modulation scheme may be any of phase modulation, amplitude modulation, frequency modulation, or a combination of any two or more selected from among them. As the circuit system, a direct conversion system was exemplified in FIG. 14. However, it may be a suitable one other than this. For example, it may be a double super-heterodyne system as well. Further, FIG. 14 schematically shows only the principal part in which a low pass filter or isolator etc. may be added at a suitable position or the position of the amplifier or the like may be changed.

Modification

FIG. 15 is a view the same as FIG. 13 and shows a modification concerned with the connection of the capacitance element 31.

In a duplexer 117 according to this modification, the capacitance element 31 is not connected in parallel to an IDT electrode 5, but is connected in series between the IDT electrode 5 and the ground. Further, the capacitance element 31 configures a serial resonance circuit together with the inductor 119.

In such a configuration, for example, a signal out of the passband of the filter configured by the IDT electrode 5 can escape to the ground through the capacitance element 31.

Such a capacitance element 31 may be provided for any IDT electrode 5 in the duplexer 117 as well. In the shown example, the capacitance element 31 is provided for the IDT electrode 5 of the serial resonator which is nearest the antenna terminal 103. Note that, the notation in the first embodiment is used as the notation of the capacitance element, but a capacitance element in another embodiment may be provided as well.

As shown in this modification, the capacitance element is not limited to one connected in parallel with respect to an IDT electrode. Further, the object of provision of the capacitance element connected to an IDT electrode is not limited to the one illustrated in the embodiment etc.

The present invention is not limited to the above embodiments and may be executed in various aspects.

The embodiments explained above may be suitably combined. For example, in the aspects as in the second to sixth embodiments in which the electrode fingers in the capacitance element are inclined relative to the electrode fingers in the excitation electrode (IDT electrode) or the electrode fingers are bent or curved, the configurations interrupting the regular continuity of the plurality of electrode fingers as in the seventh to 10th embodiments may be applied. Further, for example, the change of the pitch and the change of the duty ratio may be combined as well.

In the acoustic wave device, the insulator (cover 9) arranged on the capacitance element 31 is not limited to the cover 9 so far as it can suppress the deformation due to the resonance of the capacitance element 3. For example, the capacitance element 31 may be formed inside the frame 19, and a insulator which is sufficiently thick compared with the so-called protective layer 35 may be separately provided. Further, the capacitance element 31 may be formed outside the frame 19 as well.

Further, in the acoustic wave device, the lid 21 may be formed by a material different from that for the frame 19 as well. For example, as the lid 21, a piezoelectric substrate or organic substrate or the like can be exemplified. In this case, the strength of the lid 21 can be raised.

The position of the capacitance element relative to the excitation electrode is not limited to that on the extension of the path of propagation of the acoustic wave by the excitation electrode. For example, the capacitance element may be positioned on the lateral side of the propagation direction of the acoustic wave relative to the excitation electrode. In this case, for example, the liability of the acoustic wave caused by the excitation electrode influencing the characteristics of the capacitance element is reduced.

The acoustic wave device is not limited to a SAW device. For example, the acoustic wave device may be a thin film piezoelectric resonator or may be an elastic boundary wave device (note, included in a SAW device in the broad sense). Note that, in the elastic boundary wave device, a cavity (vibration space) above the excitation electrode is unnecessary. In such a device, if an insulator made of a material different from that for the insulator superimposed on the excitation electrode is superimposed on the capacitance element, it can be said that an insulator is superimposed only on the capacitance element between the excitation electrode and the capacitance element.

Further, the acoustic wave device is not limited to a wafer level packaged one. For example, the acoustic wave device may be configured by an acoustic wave element having a piezoelectric substrate and an excitation electrode positioned on its major surface which is mounted so that its major surface faces the device substrate with a clearance and by sealing that mounted piezoelectric substrate by resin.

Further, in an acoustic wave device, the protective layer and rear face part are not essential requirements, therefore may be omitted as well. Conversely, in an acoustic wave device, a reinforcing layer made of metal provided on the lid, an insulation layer covering the reinforcing layer, a conductive layer positioned between the frame and the lid, an insulation film covering the upper surface and side surfaces of the cover, or another suitable layer may be added as well.

The embodiments showed an example in which the element substrate was configured by a stacked substrate. However, the element substrate may be configured by only a piezoelectric substrate as well. Further, the embodiments showed the case where the protective layer was relatively thin. However, for the purpose of temperature compensation, a protective layer thicker than the excitation electrode etc. may be provided as well. The embodiments showed an acoustic wave device where the pads on the piezoelectric substrate were exposed from the cover. However, in an acoustic wave device, columnar terminals which are provided standing on the pad and penetrate through the cover may be provided as well. Further, solder or other bumps may be provided on those columnar terminals as well.

The shape of the pair of comb-shaped electrodes configuring the excitation electrode may be a known suitable shape. For example, the shape of the comb-shaped electrodes may be a shape where apodizing changing the length of the electrode fingers etc. is applied or may be a shape provided with dummy electrode fingers having front ends made to face the front ends of the electrode fingers through a gap or may be such shape where the bus bars extend with an inclination relative to the propagation direction of the acoustic wave (the electrode fingers are arranged in a direction inclined relative to the width direction thereof along with that). Further, an insulation film having substantially the same shape as that of the electrode fingers may be formed on the upper surfaces of the electrode fingers, or the cross-sectional shape of the electrode fingers may be polygonal other than rectangular. Note that, these various shapes may be applied to the comb-shaped electrodes configuring the capacitance element as well.

The insulator superimposed only on the capacitance element between the excitation electrode and the capacitance element is not limited to one made of a resin or organic material, but may be one made of an inorganic material as well. For example, it may be one made of $SiO_2$. Further, the insulator is not limited to the cover for forming a vibration space above the excitation electrode. For example, it may be a resin layer which is provided separately from the cover as well.

The method of production of the acoustic wave device is not limited to those exemplified in the embodiments. For example, the cover configuring the vibration space may be formed by forming a sacrificial layer in a region which becomes the vibration space and then forming a resin layer which becomes the cover on the sacrifice layer, then dissolving and flushing away the sacrificial layer from the inside of the resin layer.

Note that, from the embodiments of the present application, the following inventions which do not have the insulator superimposed only on the capacitance element between the excitation electrode and the capacitance element as a requirement can be extracted. This is because the measures of reducing the resonance of the capacitance element as explained above such as the arrangement of the insulator, inclination of electrode fingers, or discontinuity of the electrode fingers independently exert their effects. The characteristics can be improved by employing a plurality of measures superposed, while there is no problem even if individual measures are employed independently.

(Separate Invention 1)
An acoustic wave device including:
a piezoelectric substrate,
an excitation electrode on a major surface of the piezoelectric substrate, and
a capacitance element which is located on the major surface and is connected to the excitation electrode, wherein
the excitation electrode is configured by a pair of comb-shaped electrodes including pluralities of electrode fingers which extend in parallel and arranged so that the pluralities of electrode fingers cross each other,
the capacitance element is configured by a pair of comb-shaped electrodes including pluralities of electrode fingers which extend in parallel and arranged so that the pluralities of electrode fingers cross each other,
the angle of the pluralities of electrode fingers in the capacitance element relative to the pluralities of electrode fingers in the excitation electrode is 0° or more and less than 90°, and
the pluralities of electrode fingers in the capacitance element are bent or curved.

(Separate Invention 2)
An acoustic wave device including:
a piezoelectric substrate,
an excitation electrode on a major surface of the piezoelectric substrate, and
a capacitance element which is located on the major surface and is connected to the excitation electrode, wherein
the excitation electrode is configured by a pair of comb-shaped electrodes including pluralities of electrode fingers which extend in parallel and arranged so that the pluralities of electrode fingers cross each other,
the capacitance element is configured by a pair of comb-shaped electrodes including pluralities of electrode fingers which extend in parallel and arranged so that the pluralities of electrode fingers cross each other,
the angle of the pluralities of electrode fingers in the capacitance element relative to the pluralities of electrode fingers in the excitation electrode is 0° or more and less than 90°, and
in a part of the pluralities of electrode fingers in the capacitance element, two or more electrode fingers belonging to the same comb-shaped electrode are adjacent to each other.

(Separate Invention 3)
An acoustic wave device including:
a piezoelectric substrate,
an excitation electrode on a major surface of the piezoelectric substrate, and
a capacitance element which is located on the major surface and is connected to the excitation electrode, wherein
the excitation electrode is configured by a pair of comb-shaped electrodes including pluralities of electrode fingers which extend in parallel and arranged so that the pluralities of electrode fingers cross each other,
the capacitance element is configured by a pair of comb-shaped electrodes including pluralities of electrode fingers which extend in parallel and arranged so that the pluralities of electrode fingers cross each other,
the angle of the pluralities of electrode fingers in the capacitance element relative to the pluralities of electrode fingers in the excitation electrode is 0° or more and less than 90°, and
the pitch of the pluralities of electrode fingers in the capacitance element changes.

(Separate Invention 4)
An acoustic wave device including:
a piezoelectric substrate,
an excitation electrode on a major surface of the piezoelectric substrate, and
a capacitance element which is located on the major surface and is connected to the excitation electrode, wherein
the excitation electrode is configured by a pair of comb-shaped electrodes including pluralities of electrode fingers which extend in parallel and arranged so that the pluralities of electrode fingers cross each other,
the capacitance element is configured by a pair of comb-shaped electrodes including pluralities of electrode fingers which extend in parallel and arranged so that the pluralities of electrode fingers cross each other,
the angle of the pluralities of electrode fingers in the capacitance element relative to the pluralities of electrode fingers in the excitation electrode is 0° or more and less than 90°, and
the duty ratio of the pluralities of electrode fingers in the capacitance element changes.

In all of the above separate inventions 1 to 4, the angle of the pluralities of electrode fingers in the capacitance element relative to the pluralities of electrode fingers in the excitation electrode is 0° to less than 90°, therefore the insertion loss is reduced. If the angle is controlled to 0° to less than 90°, spurious emission out of the band of the excitation electrode is apt to become large. However, a measure is taken for reducing the resonance of the capacitance element, therefore the spurious emission is reduced. As a whole, an acoustic wave device having good characteristics is obtained.

REFERENCE SIGNS LIST

1 . . . SAW device (acoustic wave device), 3a . . . first major surface (major surface), 5 . . . IDT electrode (excitation electrode), 9 . . . cover (insulator), 13 . . . piezoelectric substrate, 29 . . . comb-shaped electrode, and 31 . . . capacitance element.

The invention claimed is:

1. An acoustic wave device comprising:
a piezoelectric substrate,
an excitation electrode on a major surface of the piezoelectric substrate,
a capacitance element which is located on the major surface and is connected to the excitation electrode, and
an insulator consisting of resin and which is superimposed only on the capacitance element between the excitation electrode and the capacitance element, wherein
the excitation electrode and the capacitance element are in contact with the major surface, the insulator is a frame that includes openings, surrounds the excitation electrode, and is superimposed on the capacitance element, and further including a lid that closes the openings of the frame.

2. The acoustic wave device according to claim 1, wherein the capacitance element is configured by a pair of comb-shaped electrodes comprising pluralities of electrode fingers which extend in parallel and arranged so that the pluralities of electrode fingers cross each other.

3. The acoustic wave device according to claim 2, wherein:
the excitation electrode is configured by a pair of comb-shaped electrodes comprising pluralities of electrode fingers which extend in parallel and arranged so that the pluralities of electrode fingers cross each other, and
the angle of the pluralities of electrode fingers in the capacitance element relative to the pluralities of electrode fingers in the excitation electrode is 0° or more and less than 90°.

4. The acoustic wave device according to claim 3, wherein the angle is 45° or less.

5. The acoustic wave device according to claim 2, wherein the pluralities of electrode fingers in the capacitance element extend from a pair of bus bars facing each other toward a direction which is inclined to the opposite direction of the pair of bus bars.

6. The acoustic wave device according to claim 2, wherein the pluralities of electrode fingers in the capacitance element are bent or curved.

7. The acoustic wave device according to claim 2, wherein, in a part of the pluralities of electrode fingers in the capacitance element, two or more electrode fingers belonging to the same comb-shaped electrode are adjacent to each other.

8. The acoustic wave device according to claim 2, wherein the pitch of the pluralities of electrode fingers in the capacitance element changes.

9. The acoustic wave device according to claim 2, wherein the duty ratio of the pluralities of electrode fingers in the capacitance element changes.

10. The acoustic wave device according to claim 1, further comprising a support substrate adhered to the piezoelectric substrate.

11. An acoustic wave device comprising:
an element substrate comprising a piezoelectric substrate,
an excitation electrode on the element substrate,
a capacitance element on the element substrate, and
an insulator consisting of resin and which is superimposed only on the capacitance element between the excitation electrode and the capacitance element, wherein
a lower surface of the excitation electrode and a lower surface of the capacitance element are located on the same plane, the insulator is a frame that includes openings, surrounds the excitation electrode, and is superimposed on the capacitance element, and further including a lid that closes the openings of the frame.

12. The acoustic wave device according to claim 11, wherein the capacitance element is configured by a pair of comb-shaped electrodes comprising pluralities of electrode fingers which extend in parallel and arranged so that the pluralities of electrode fingers cross each other.

13. An acoustic wave device comprising:
an element substrate comprising a piezoelectric substrate,
an excitation electrode on the element substrate,
a capacitance element on the element substrate, and
an insulator consisting of resin and which is superimposed only on the capacitance element between the excitation electrode and the capacitance element, wherein
an upper surface of the capacitance element is not higher than an upper surface of the excitation electrode, the insulator is a frame that includes openings, surrounds the excitation electrode, and is superimposed on the capacitance element, and further including a lid that closes the openings of the frame.

14. The acoustic wave device according to claim 13, wherein the capacitance element is configured by a pair of comb-shaped electrodes comprising pluralities of electrode fingers which extend in parallel and arranged so that the pluralities of electrode fingers cross each other.

* * * * *